US007474753B2

(12) United States Patent
Araya et al.

(10) Patent No.: US 7,474,753 B2
(45) Date of Patent: Jan. 6, 2009

(54) SOUND FIELD CONTROL APPARATUS, SIGNAL PROCESSING APPARATUS, SOUND FIELD CONTROL PROGRAM, AND SIGNAL PROCESSING PROGRAM

(75) Inventors: Toshinori Araya, Iwata (JP); Akio Suyama, Hamamatsu (JP); Keiji Kawakami, Hamamatsu (JP)

(73) Assignee: Yamaha Corporation, Hamamatsu-Shi (JP)

( * ) Notice: Subject to any disclaimer, the term of this patent is extended or adjusted under 35 U.S.C. 154(b) by 176 days.

(21) Appl. No.: 10/926,724

(22) Filed: Aug. 25, 2004

(65) Prior Publication Data

US 2005/0047608 A1 Mar. 3, 2005

(30) Foreign Application Priority Data

Aug. 28, 2003 (JP) ............................ 2003-209287
Aug. 28, 2003 (JP) ............................ 2003-209288
Aug. 28, 2003 (JP) ............................ 2003-209289

(51) Int. Cl.
*H03G 3/00* (2006.01)

(52) U.S. Cl. ............................ 381/63; 381/61; 381/77; 381/82

(58) Field of Classification Search ............. 381/61–63, 381/300, 107, 77–85, 181–379, 411
See application file for complete search history.

(56) References Cited

U.S. PATENT DOCUMENTS 4,061,876 A * 12/1977 Jaffe ........................... 381/63
5,119,428 A * 6/1992 Prinssen ...................... 381/83
5,452,360 A 9/1995 Yamashita et al.
6,072,879 A * 6/2000 Ouchi et al. .................. 381/61
6,157,724 A 12/2000 Kawakami
6,901,149 B2 * 5/2005 Suruga ....................... 381/119
7,099,482 B1 * 8/2006 Jot et al. ...................... 381/61

(Continued)

OTHER PUBLICATIONS

Convention Paper, Audio Engineering Society, "*Active Field Control (AFC) Reverberation Enhancement System Using Acoustical Feedback Control*", Oct. 10-13, 2003, New York, New York, Hideo Miyazaki, Takayuki Watanabe, Shinji Kishinaga and Fukushi Kawakami, Yamaha Corporation, Advanced System Development Center, Hamamatsu, Shizuoka, 430-8650, Japan.

*Primary Examiner*—Vivian Chin
*Assistant Examiner*—Disler Paul
(74) *Attorney, Agent, or Firm*—Morrison & Foerster LLP

(57) ABSTRACT

A sound field control apparatus which is capable of adjusting the number of outputs as required. The sound field control apparatus is comprised of a master device, and a plurality of salve devices serially connected in cascade to the master device. In the master device, a picked-up sound signal input section inputs picked-up sound signals from a plurality of microphones. A signal processing section generates reflected sound signals from the input picked-up sound signals. A cascade output terminal outputs the reflected sound signals. In each of the slave devices, a cascade input terminal inputs the generated reflected sound signal, a plurality of signal processing sections correspond to a plurality of speakers and each adjust sound characteristics of the input reflected sound signals and generate and output signals to the corresponding speakers. A cascade output terminal directly outputs the input reflected sound signals. A desired number of slave devices are serially connected in cascade to the master device, and the speakers correspond in number to a number of the slave devices.

13 Claims, 9 Drawing Sheets

U.S. PATENT DOCUMENTS

| | | | | |
|---|---|---|---|---|
| 2003/0035556 | A1* | 2/2003 | Curtis et al. | 381/105 |
| 2003/0063755 | A1* | 4/2003 | Nourse et al. | 381/82 |
| 2003/0063785 | A1* | 4/2003 | Oosawa | 382/128 |
| 2003/0128850 | A1* | 7/2003 | Kimura et al. | 381/82 |
| 2003/0185404 | A1* | 10/2003 | Milsap | 381/77 |
| 2003/0228020 | A1* | 12/2003 | Lentinturier et al. | 381/77 |
| 2003/0235316 | A1* | 12/2003 | Chambers et al. | 381/119 |
| 2004/0091122 | A1* | 5/2004 | Bavholm et al. | 381/80 |

* cited by examiner

SOUND FIELD CONTROL APPARATUS, SIGNAL PROCESSING APPARATUS, SOUND FIELD CONTROL PROGRAM, AND SIGNAL PROCESSING PROGRAM

BACKGROUND OF THE INVENTION

1. Field of the Invention

The present invention relates to a sound field control apparatus, a signal processing apparatus, and a sound field control program which generate reflected sound signals from picked-up sound signals output from a plurality of microphones installed in a room, and outputs output sounds (output sounds) based on the generated reflected sound signals from a plurality of speakers installed in the room, thereby enhancing the feeling of reverberation and expansion of the room itself, as well as a signal processing program.

2. Description of the Related Art

Conventionally, as an example of a sound field control apparatus which enhances the feeling of reverberation and expansion of a hall or a room, a sound field control apparatus employing an acoustic feedback system has been known (refer to Japanese Laid-Open Patent Publication (Kokai) No. 2001-228867, for example). This sound field control apparatus is constructed such that speakers and microphones are installed at a suitable distance from each other in a hall or a room, and sounds picked up by the microphones are supplied to an FIR (Finite Impulse Response: non-recursive type) filter via a head amplifier to generate reverberation signals which are primarily composed of initial reflected sound signals. The generated reverberation signals are amplified and reproduced via the speakers, and the reproduced sounds are picked up again by the microphones. By repeating this sequence, the sound field control apparatus causes increase in the level of sound pressure to enhance the feeling of sound volume, extension of the reverberation time to enhance the feeling of reverberation, and intensification of sideway reflected sound energy to enhance the feeling of expansion.

The above conventional sound field control apparatus is constructed such that the number of microphones and the number of speakers are the same, but actually, the number of speakers is increased or decreased depending on the dimensions of the installation space such as a hall or a room. For this reason, there may be a case where the number of speakers is considerably larger than the number of microphones. In this case, the number of outputs to the speakers from the conventional sound field control apparatus is fixed, and hence, if the number of outputs is small, the sound field control apparatus is not suitable for a large hall, and if the number of outputs is large, a large number of outputs are not used in a small room.

Also, it can be envisaged that the number of outputs is increased by adding sound field control apparatuses, but in this case, when the user selects a desired sound field pattern, sound field control data for the selected sound field pattern must be transferred to the added sound field control apparatuses, and therefore, it takes a lot of time to switch sound field control data among the plurality of sound field control apparatuses.

Similarly, in the case where the number of outputs is increased by adding sound field control apparatuses, if devices sharing functions constitute one sound field control apparatus, the sound field control apparatus is comprised of a plurality of types of devices having different constructions adapted to the respective shared functions. Thus, in case that any of the devices fails, a device adapted to a function of the failed device must be prepared in advance for replacement, and therefore it is necessary to prepare a plurality of types of spare devices in advance.

Further, when installing the sound field control apparatus, sound field control data for obtaining a desired sound field pattern to be set in the sound field control apparatus is adjusted according to a space where the sound field control apparatus is installed by an installer, so that plural pieces of sound field control data suitable for the space are stored in a nonvolatile memory such as a flash memory in the sound field control apparatus. The user cannot change the sound field control data. Thus, when the sound field control apparatus fails, even if the failed sound field control apparatus is replaced by a new sound field control apparatus of the same type, sound field control data stored in the new sound field control apparatus is not suitable for the space, and hence it is impossible to properly operate the new sound field control apparatus. For this reason, the installer needs to back up sound field control data which has been adjusted in installation for recovery from failure, and write the backed-up sound field control data in a nonvolatile memory of a new sound field control apparatus in case of a failure. It is necessary to use a personal computer for writing this backup data, and to carry this personal computer which stores the backed-up control data to the place of the failure.

SUMMARY OF THE INVENTION

It is therefore a first object of the present invention to provide a sound field control apparatus which is capable of adjusting the number of outputs as required.

It is a second object of the present invention to provide a sound field control apparatus and a sound field control program which are capable of providing sound field control without requiring a high-speed communication path.

It is a third object of the present invention to provide a signal processing apparatus, a sound field control apparatus, a signal processing program, and a sound field control program which are capable of reducing the number of types of devices to be prepared in case of a failure in the case where a plurality of devices sharing functions constitute the sound field control apparatus.

It is a fourth object of the present invention to provide a sound field control apparatus and a sound field control program which do not require a personal computer storing backed-up control data in case of a failure.

To attain the first object, in a first aspect of the present invention, there is provided a sound field control apparatus comprising a master device comprising at least a picked-up sound signal input section that inputs picked-up sound signals from a plurality of microphones installed at different locations, a reflected sound signal generating section that generates reflected sound signals from the input picked-up sound signals, and a reflected sound signal output section that outputs the generated reflected sound signals, and a plurality of slave devices connected in cascade to the master device, each of the slave devices comprising a reflected sound signal input section that inputs the generated reflected sound signal from the master device, and a plurality of output signal generating sections corresponding to a plurality of speakers installed at different locations, each of the plurality of output signal generating sections adjusting sound characteristics of the input reflected sound signals and generating and outputting signals to the corresponding speakers, and a reflected sound signal output section that directly outputs the input reflected sound signals, the slave devices comprise a desired number of slave devices serially connected in cascade to the master device, and the speakers correspond in number to a number of the slave devices.

According to the first aspect of the present invention, the number of outputs can be adjusted depending on the number of slave devices connected in cascade.

To attain the second object, in a preferred form of the first aspect, the master device further comprises a first storage device that stores plural pieces of first sound field control data for controlling a reflected sound signal generating process carried out by the reflected sound signal generating section, a first selecting device that selects one piece of the first sound field control data from among the plural pieces of the first sound field control data stored in the first storage device according to a user's selecting operation, and a transmitting device that transmits selection information indicative of the user's selecting operation to the slave devices serially connected in cascade, and wherein the reflected sound signal generating section of the master device generates reflected sound signals based on the sound field control data selected by the first selecting device, and each of the slave devices further comprises a second storage device that stores plural pieces of second sound field control data for controlling an output signal generating process carried out by the plurality of output signal generating sections, and a second selecting device that selects one piece of the second sound field control data from among the plural pieces of the second sound field control data stored in the second storage device according to the selection information transmitted from the master device, and each of the plurality of output signal generating sections adjusts the sound characteristics according to the second sound field control data selected by the second selecting device.

With this arrangement, common sound field control data can be stored in the master device and the slave devices. Therefore, transmission of only a designation signal which designates any of sound field control data to the master device and slave devices connected in cascade suffices for providing sound field control by switching sound field control data, to thereby eliminate the necessity of providing a high-speed communication path.

To attain the third object, in a second aspect of the present invention, there is provided a signal processing control apparatus comprising, a plurality of common signal processing apparatuses identical in construction, serially connected in cascade to each other, each of the common signal processing apparatuses comprising a cascade input/output section that inputs signals from one of the common signal processing apparatuses which is upstream of the common signal processing apparatus and outputs signals to another one of the common signal processing apparatuses which is downstream of the common signal processing apparatus, a determining device that determines on which stage the common signal processing apparatus is connected in cascade, a storage device that stores operation control data including a master algorithm and a slave algorithm, an external signal input/output section that externally inputs and outputs signals, and a signal processing section operable when the determining device determines that the common signal processing apparatus is connected in cascade on a first stage, to form reflected sound signals by performing signal processing on microphone picked-up signals input from the external signal input/output section according to the master algorithm within the operation control data stored in the storage device, and output the formed reflected sound signals to ones of the common signal processing apparatuses, which are connected in cascade on second and subsequent stages, the signal processing section being operable when the determining device determines that the common signal processing apparatus is connected in cascade on the second or a subsequent stage, to form speaker output signals by performing signal processing on the reflected sound signals input from the common signal processing apparatus connected in cascade on the first stage via the cascade input/output section according to the slave algorithm within the operation control data stored in the storage device, and output the formed speaker output signals to the external signal input/output section.

According to the second aspect of the present invention, the master device and the slave device(s) having different functions can be implemented by the common sound field apparatuses identical in construction, and therefore, even when either (any) of the master device and the slave device(s) constituting the sound field control apparatus fails, the failed common sound field apparatus can be replaced by a new one only if common sound field apparatuses of the same type are prepared in advance.

Preferably, each of the common signal processing apparatuses further comprises at least one connection terminal for connecting to at lease one external apparatus selected from the group consisting of a computer, a MIDI machine, and a control panel, and a communication device operable when the determining device determines that the common signal processing apparatus is connected in cascade on the first stage, to carry out communication with the at least one external apparatus connected to the connection terminal and control overall operation of the signal processing apparatus according to a result of the communication.

With this arrangement, a master device capable of controlling the overall operation of the sound field control apparatus is automatically constructed only by cascade connection of common sound field control apparatuses. Since the master device controls the overall operation of the sound field control apparatus, the interference of control does not occur as a whole due to the centralization of control. Further, common sound field apparatuses have only to be connected in cascade without considering the types of the devices, making it easier to set the sound field control apparatus.

To attain the above third object, in a third aspect of the present invention, there is provided a sound field control apparatus comprising a plurality of common sound field apparatuses identical in construction, serially connected in cascade to each other, each of the common sound field apparatuses comprising a cascade input/output section that inputs signals from one of the common sound field apparatuses which is upstream of the common sound field apparatus and outputs signals to another one of the common sound field apparatuses which is downstream of the common sound field apparatus, a determining device that determines on which stage the common sound field apparatus is connected in cascade, a storage device that stores operation control data including a master algorithm and a slave algorithm, and master and slave sound field control parameters for obtaining a desired sound field pattern, an external signal input/output section that externally inputs and outputs signals, a signal processing section operable when the determining device determines that the common sound field apparatus is connected in cascade on a first stage, to form reflected sound signals by performing signal processing on microphone picked-up signals input from the external signal input/output section according to the master algorithm within the operation control data stored in the storage device, and output the formed reflected sound signals to ones of the common sound field apparatuses, which are connected in cascade on second and subsequent stages, the signal processing section being operable when the determining device determines that the common sound field apparatus is connected in cascade on the second or a subsequent stage, to form speaker output signals by performing signal processing on the reflected sound signals input from the common sound field apparatus connected in cascade on the first stage via the cascade input/output section according to the slave algorithm within the operation control data stored in the storage device, and output the formed speaker output signals to the external signal input/output section, and a parameter supply device operable when the determining device determines that the common sound field apparatus is connected in cascade on the first stage, to fetch the master sound field control parameters stored in the storage device and supply the fetched master sound field control parameters to the signal processing section, and operable when the determining device determines that the common sound field apparatus is connected in cascade on the second or a subsequent stage, to fetch sound field control parameters for the determined stage from the slave sound field control parameters stored in the storage device and supply the fetched sound field control parameters to the signal processing section.

According to the third aspect of the present invention, irrespective of whether a common sound field apparatus operates as the master device or a slave device, sound field control parameters are stored in the common sound field apparatus itself, making it possible to switch sound field parameters at a high speed when turning on power supply or changing sound field patterns.

Preferably, the sound field control comprises a sound field pattern designating device capable of designating one of a plurality of sound field patterns, and the storage device of the common sound field apparatus stores a plurality of master and slave sound field control parameters corresponding to the plurality of sound field patterns, and the parameter supply device is operable when the determining device determines that the common sound field apparatus is connected in cascade on the first stage, to fetch the master sound field control parameters corresponding to the sound field pattern designated by the sound field pattern designating device from the storage device and supply the fetched master sound field control parameters to the signal processing section, and is operable when the determining device determines that the common sound field apparatus is connected in cascade on the second or a subsequent stage, to fetch sound field control parameters corresponding to the sound field pattern designated by the sound field designating device from the storage device and supply the fetched slave sound field control parameters to the signal processing section.

Also preferably, the sound field control apparatus comprises a copying device responsive to a copying instruction, for copying the operation control data and the master and slave sound field control parameters between the storage device of the common sound field apparatus and the storage device of each of the other common sound field apparatuses connected in cascade to the common sound field apparatus.

With this arrangement, when either (any) of the master device and the slave device(s) constituting the sound field control apparatus fails, the failed device can be easily replaced by a new common sound field apparatus while being supplied with operation control data and sound field control programs from a common sound field apparatus which has not failed. Further, when the common sound field apparatus operates as either (any) of the master device and the slave device(s), it is possible to switch sound field parameters at a high speed when turning on power supply or changing sound field patterns since sound field control parameters are stored in the common sound field apparatus itself.

To attain the fourth object, in a fourth aspect of the present invention, there is provided a sound field control apparatus comprising a master device, at least one slave device connected in cascade to the master device, the master device comprises a first storage device that stores at least master and slave sound field control data for obtaining a desired sound field pattern, an external input section that inputs picked-up sound signals from a plurality of microphones installed at different locations, a reflected sound signal generating section that performs signal processing on the input picked-up sound signals according to the master sound field control data stored in the first storage device to generate reflected sound signals, and a cascade output section that outputs the generated reflected sound signals to the slave device connected in cascade to the master device, the slave device comprises a second storage device that stores at least sound field control data identical with the master and slave sound field control data, a cascade input section that inputs the reflected sound signals from the master device to which the slave device is connected in cascade, an external output section that output a plurality of output signals to be sounded by a plurality of speakers installed at different locations, and an output signal generating section that performs signal processing on the input reflected sound signals according to the slave sound field control data stored in the second storage device to generate the plurality of output signals, and a copying device responsive to a copying instruction, for copying the sound field control data between the first storage device of the master device and the second storage device of the slave device.

According to the fourth aspect of the present invention, sound field control data can be stored in each of the master device and the slave device(s), and therefore, it is possible to switch sound field parameters at a high speed when turning on power supply or changing sound field patterns. Further; when either (any) of the master device and the slave device(s) constituting the sound field control apparatus fails, sound field control data is copied from a device which has not failed to a device which has replaced the failed device so that the proper operation can be resumed, thus eliminating the necessity of preparing a personal computer which stores backed-up sound field control data.

To attain the third object, in a fifth aspect of the present invention, there is provided a signal processing program executed by a signal processing apparatus comprising a plurality of common signal processing apparatuses identical in construction, serially connected in cascade to each other, comprising a cascade input/output module for inputting signals from one of the common signal processing apparatuses which is upstream of each of the common signal processing apparatuses and outputting signals to another one of the common signal processing apparatuses which is downstream of the common signal processing apparatus, a determining module for determining on which stage the common signal processing apparatus is connected in cascade, a storage module for storing operation control data including a master algorithm and a slave algorithm, an external signal input/output module for externally inputting and outputting signals, and a signal processing module operable when the determining module determines that the common signal processing apparatus is connected in cascade on a first stage, to form reflected sound signals by performing signal processing on microphone picked-up signals input by the external signal input/output module according to the master algorithm within the operation control data stored by the storage module, and output the formed reflected sound signals to ones of the common signal processing apparatuses, which are connected in cascade on second and subsequent stages, the signal processing module being operable when the determining module determines that the common signal processing apparatus is connected in cascade on the second or a subsequent stage, to form speaker output signals by performing signal processing on the reflected sound signals input from the common signal processing apparatus connected in cascade on the first stage via the cascade input/output module according to the slave algorithm within the operation control data stored by the storage module, and output the formed speaker output signals to the external signal input/output module.

To attain the third object, in a sixth aspect of the present invention, there is provided a sound field control program executed by a sound field control apparatus comprising a plurality of common sound field apparatuses identical in construction, serially connected in cascade to each other, comprising a cascade input/output module for inputting signals from one of the common sound field apparatuses which is upstream of each of the common sound field apparatuses and outputting signals to another one of the common sound field apparatuses which is downstream of the common sound field apparatus, a determining module for determining on which stage the common sound field apparatus is connected in cascade, a storage module for storing operation control data including a master algorithm and a slave algorithm, and master and slave sound field control parameters for obtaining a desired sound field pattern, an external signal input/output module for externally inputting and outputting signals, a signal processing module operable when the determining module determines that the common sound field apparatus is connected in cascade on a first stage, to form reflected sound signals by performing signal processing on microphone picked-up signals input by the external signal input/output module according to the master algorithm within the operation control data stored by the storage module, and output the formed reflected sound signals to ones of the common sound field apparatuses, which are connected in cascade on second and subsequent stages, the signal processing module being operable when the determining device module that the common sound field apparatus is connected in cascade on the second or a subsequent stage, to form speaker output signals by performing signal processing on the reflected sound signals input from the common sound field apparatus connected in cascade on the first stage via the cascade input/output module according to the slave algorithm within the operation control data stored by the storage module, and output the formed speaker output signals to the external signal input/output module, and a parameter supply module operable when the determining module determines that the common sound field apparatus is connected in cascade on the first stage, to fetch the master sound field control parameters stored in the storage module and supply the fetched master sound field control parameters to the signal processing module, the parameter supply module being operable when the determining module determines that the common sound field apparatus is connected in cascade on the second or a subsequent stage, to fetch sound field control parameters for the determined stage from the slave sound field control parameters stored by the storage module and supply the fetched sound field control parameters to the signal processing module.

To attain the fourth object, in a seventh aspect of the present invention, there is provided a sound field control program executed by a sound field control apparatus comprising a master device and at least one slave device connected in cascade to the master device, comprising a first storage module for storing at least master and slave sound field control data for obtaining a desired sound field pattern, in the master device, an external input module for inputting picked-up sound signals from a plurality of microphones installed at different locations, a reflected sound signal generating module for performing signal processing on the input picked-up sound signals according to the master sound field control data stored by the first storage module to generate reflected sound signals, a cascade output module for outputting the generated reflected sound signals to the slave module connected in cascade to the master device, a second storage module for storing at least sound field control data identical with the master and slave sound field control data, in the slave device, a cascade input module for inputting the reflected sound signals from the master module to which the slave device is connected in cascade, an external output module for output a plurality of output signals to be sounded by a plurality of speakers installed at different locations, an output signal generating module for performing signal processing on the input reflected sound signals according to the slave sound field control data stored by the second storage module to generate the plurality of output signals, and a copying module responsive to a copying instruction, for copying the sound field control data between the first storage device of the master device and the second storage module of the slave device.

The above and other objects, features, and advantages of the invention will become more apparent from the following detailed description taken in conjunction with the accompanying drawings.

BRIEF DESCRIPTION OF THE DRAWINGS

FIG. 7 is a flow chart showing a process which is executed when power supply of the common sound field apparatus is turned on.

DETAILED DESCRIPTION OF THE PREFERRED EMBODIMENTS

The present invention will now be described in detail with reference to the drawings showing a preferred embodiment thereof.

Figure 1:
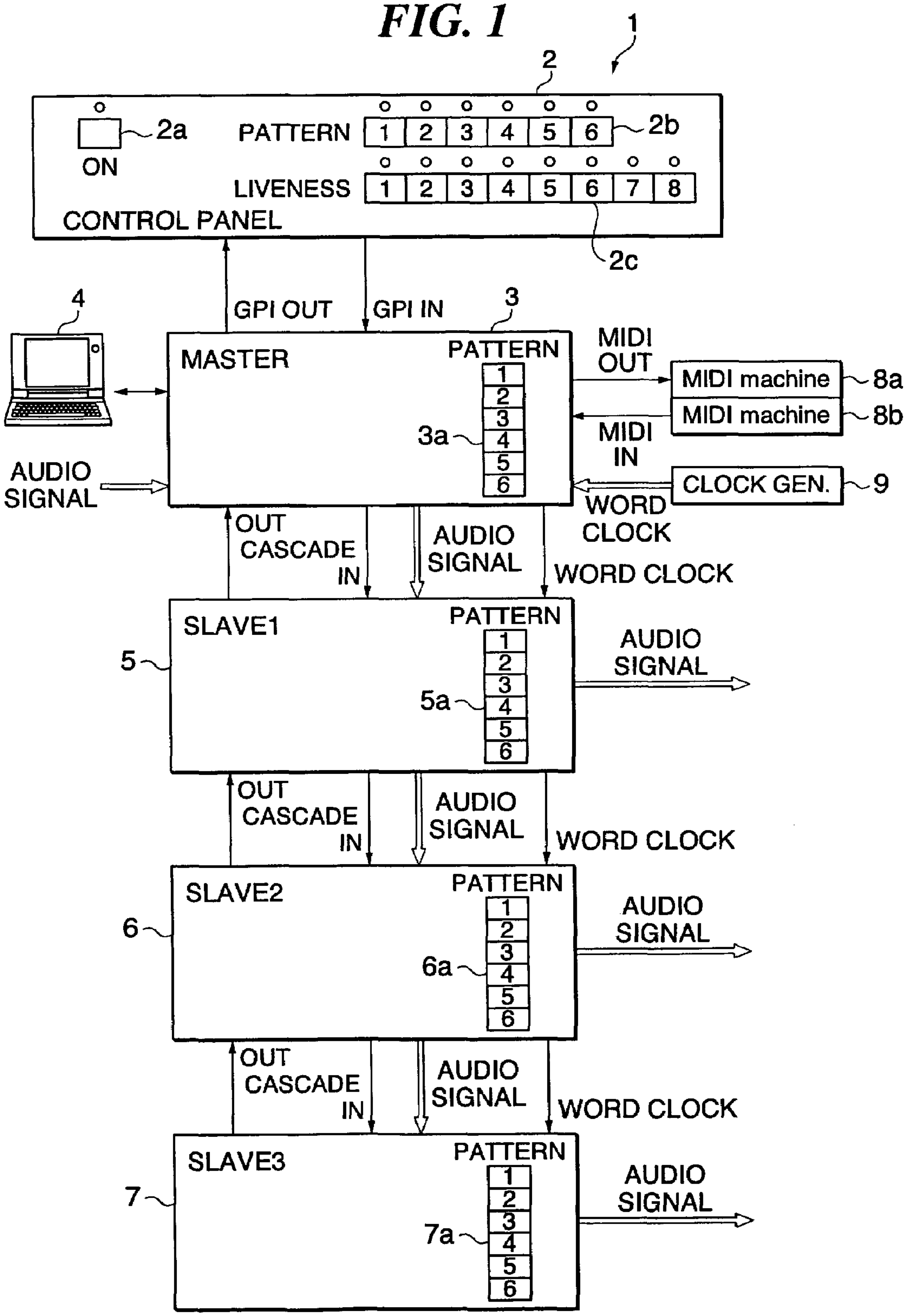
FIG. 1 is a view showing the construction of a sound field control apparatus according to an embodiment of the present invention.

FIG. 1 illustrates the construction of a sound field control apparatus according to an embodiment of the present invention.

As shown in FIG. 1, the sound field control apparatus 1 is comprised of a master device (MASTER) 3, a first slave device (SLAVE 1) 5 connected in cascade to the master device 3, a second slave device (SLAVE 2) 6 connected in cascade to the first slave device 5, a third slave device (SLAVE 3) 7 connected in cascade to the second cascade device 6. A control panel (CONTROL PANEL) 2 is connected to the master device 3. The master device 3 receives audio signals (AUDIO SIGNAL) comprised of picked-up sound signals picked up by a plurality of microphones installed in a room and sound signals of music or speech broadcasted in the room. Reflected sound signals generated from the picked-up sound signals as well as the input sound signals are output as audio signals (AUDIO SIGNAL) from a cascade output terminal (OUT).

The reflected sound signals are generated by a signal processing section implemented by DSPs (Digital Signal Processors) incorporated in the master device 3. The signal processing section operates at a sampling period synchronous with a word clock (WORD CLOCK) generated by a clock generator (CLOCK GEN.) 9 and supplied to the master device 3. The control panel 2 is comprised of a panel-on switch 2*a*, pattern switches (PATTERN) 2*b* each of which generates a designating signal for designating any of six sound field patterns according to an operation by the user, and liveness switches (LIVENESS) 2*c* each of which generates a designating signal for designating any of variations of the selected sound field pattern. These switches 2*a* to 2*c* are provided with respective lamps arranged on the top thereof, which indicate that the respective switches 2*a* to 2*c* have been operated. The control panel 2 and the master device 3 are connected to each other via cables at GPI (General Purpose Input) terminals thereof, such that a designating signal indicative of a sound field pattern selected using any of the pattern switches 2*b* and a designating signal indicative of a liveness selected using any of the liveness switches 2*c* are sent from the control panel 2 to the master device 3 via the GPI terminals. It should be noted that this GPI connection allows two-way communication.

The master device 3 has a control CPU that reads out operation data corresponding to the sound field pattern designating signal and the liveness designating signal input via the GPI terminals from a flash memory incorporated in the master device 3, loads the readout operation data into a RAM (Random Access Memory) of the master device 3, and supplies master sound field control data among the loaded operation data to the signal processing section. As a result, the signal processing section of the master device 3 generates reflected sound signals of picked-up sound signals on the basis of the supplied master sound field control data. Namely, the master device 3 generates reflected sound signals for obtaining the sound field effect of the designated liveness of the sound field pattern designated by the control panel 2. It should be noted that the master device 3 is provided with a pattern display section 3*a* which indicates a sound field pattern number designated by the control panel 2 by lighting up or blinking the number. Also, a MIDI machine 8*a* can be connected to a MIDI OUT terminal of the master device 3, and a MIDI machine 8*b* can be connected to a MIDI IN terminal of the master device 3. It is possible to designate a sound field pattern and a liveness thereof through the operation of the MIDI machine 8*b* connected to the MIDI IN terminal.

The cascade output terminal of the master device 3 and a cascade input terminal of the first slave device 5 are connected to each other via a cable, a cascade output terminal of the first slave device 5 and a cascade input terminal of the second slave device 6 are connected to each other via a cable, and a cascade output terminal of the second slave device 6 and a cascade input terminal of the third slave device 7 are connected to each other via a cable. Due to the cascade connection of the master device 3, the first slave device 5, the second slave device 6, and the third slave device 7, reflected sound signals generated by the master device 3 and sound signals input to the master device 3 are supplied to the first slave device 5, the second slave device 6, and the third slave device 7. Also, the word clock supplied from the clock generator 9 to the master device 3 and the sound field pattern designating signal and the liveness designating signal input from the control panel 2 to the master device 3 are supplied to the first slave device 5, the second slave device 6, and the third slave device 7. It should be noted that the cascade connection allows two-way communication.

The first slave device 5, the second slave device 6, and the third slave device 7 have respective CPUs, incorporated flash memories, and RAMs. The CPUs load operation data corresponding to the input sound field pattern designating signal and liveness designating signal from the incorporated flash memories into the RAMs, and supply sound field control data for the respective slave devices 5 to 7, among the loaded data, to respective signal processing sections thereof. As a result, the signal processing sections implemented by respective DSPs incorporated in the first slave device 5, the second slave device 6, and the third slave device 7 adjust and mix the delay times and levels of the supplied plurality of reflected sound signals and sound signals according to the supplied sound field control data for the respective slave devices 5 to 7 to generate audio signals which are to be supplied to the respective speakers.

It should be noted that the number of outputs from each of the first slave device 5, the second slave device 6, and the third slave device 7 to the speakers is 32, for example; 32 outputs for which the delay times and levels of a plurality of reflected sound signals and a plurality of sound signals have been adjusted according to the positions of the speakers can be output as audio signals from each of the first slave device 5, the second slave device 6, and the third slave device 7. It should be noted that the first slave device 5, the second slave device 6, and the third slave device 7 are provided with pattern display sections 5*a*, 6*a*, and 7*a*, respectively, which indicate a sound field pattern number designated by the control panel 2 by lighting up or blinking the number. Also, the number of outputs corresponds to the maximum number of speakers which can be connected to each of the first slave device 5, the second slave device 6, and the third slave device 7, and the maximum number of speakers need not always be connected to each of the slave devices 5 to 7.

By the way, to install the sound field control apparatus 1 constructed as described above, sound field control data to be set in the sound field control apparatus 1 is adjusted according to a space where the sound field control apparatus 1 is installed by an installer, so that a plurality of sound field control data suitable for the space are stored in a nonvolatile memory such as a flash memory in the sound field control apparatus 1. The master device 3 is provided with an interface (e.g. USB, IEEE 1394, RS232C, or Ethernet) to which a personal computer 4 can be connected so that an installer can adjust sound field control data. The installer connects the personal computer 4 to the interface and activates a control application in the personal computer 4 so that the sound field apparatus 1 can be remotely controlled according to the control application. To adjust sound field control data, first, sound field control data considered suitable for a space where the sound field control apparatus 1 is installed is selected from among various pieces of sound field control data stored in a mass storage of the personal computer 4 and is loaded into a RAM of the personal computer 4, and is also transferred to the master device 3, the first slave device 5, the second slave device 6, and the third slave device 7 via the cascade connection cables and stored in the respective RAMs. It should be noted that the sound field control data is operation data comprised of master control data and respective stage slave control data.

Therefore, the master device 3 operates according to the master control data within the stored operation data, and the first slave device 5, the second slave device 6, and the third slave device 7 operate, respectively, according to first slave control data, second slave control data, and third slave control data-in the stored operation data. In this case, the operation data is not necessarily suitable for the space, and hence, while operating the sound field control apparatus 1, the installer emits a test signal from a sound field measuring device into the space to measure reverberation characteristics and sound pressure characteristics of the space, and adjusts the master control data and the respective stage slave control data according to the control application in the personal computer 4 to obtain desired reverberation characteristics and sound pressure characteristics. In response to the adjusting operation, the operation data stored in the RAM of the personal computer 4 is changed, and at the same time, the adjusting operation is transmitted to the master device 3, the first slave device 5, the second slave device 6, and the third slave device 7 to change the operation data stored in the respective RAMs thereof. The sound field control apparatus 1 continuously operates according to the operation data thus changed, so that the sound field measuring device can measure the result of the adjustment in real time.

Further, as the operation data, operation data for obtaining eight variations of reverberation characteristics and sound pressure characteristics is created. Plural pieces of operation data each having eight variations thus created are stored in the mass storage of the personal computer 4 according to the control application. The installer selects six pieces of operation data from among the plural pieces of operation data, and loads the selected operation data of six patterns each having eight variations, from the personal computer 4 into respective non-volatile memories of the master device 3, the first slave device 5, the second slave device 6, and the third slave device 7. In-this case, any of the six patterns can be selected using any of the pattern switches 2*b* on the control panel 2, and any of the eight variations can be selected using any of the liveness switches 2*c*.

Figure 2:
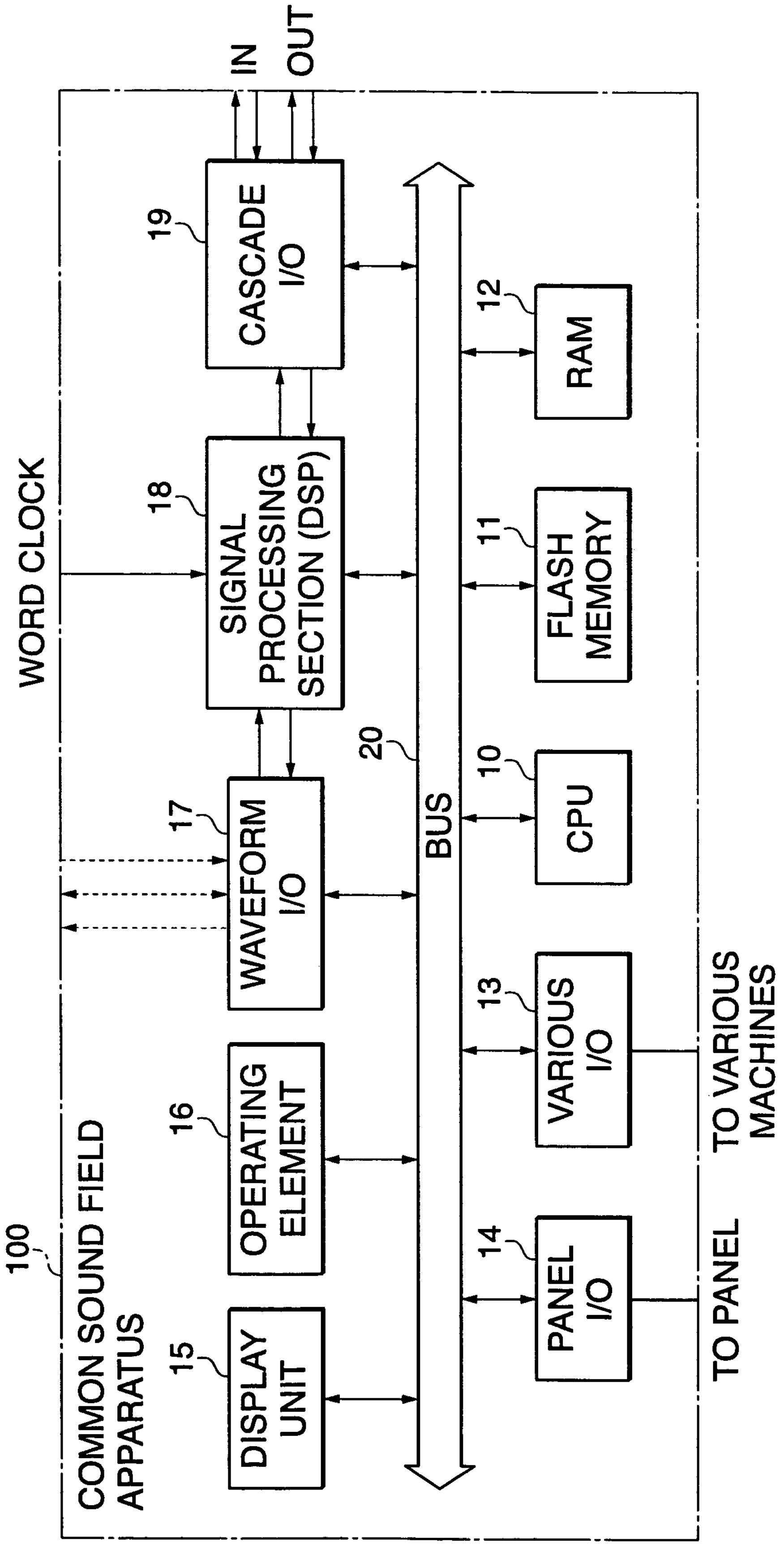
FIG. 2 is a block diagram showing the construction of a common sound field apparatus which constitutes the sound field control apparatus shown in FIG. 1.

In the present embodiment, each of the master device 3, the first slave device 5, the second slave device 6, and the third slave device 7 can be implemented by a common sound field apparatus 100 shown in FIG. 2. Specifically, the sound field control apparatus 1 in FIG. 2 can be constructed by connecting four common sound field apparatuses 100 in cascade to each other, and GPI-connecting the control panel 2 to the common sound field apparatus 100 on the first stage of the cascade connection. In this case, a CPU of the first-stage common sound field apparatus 100 to which the control panel 2 is GPI-connected causes a signal processing section the apparatus 100 to execute a master algorithm, and performs various kinds of master processing to function as the master device 3, and CPUs of the second to fourth-stage common sound field apparatuses 100 cause signal processing sections the apparatuses 100 to execute a slave algorithm, and perform various kinds of slave processing to function as the first slave device 5, the second slave device 6, and the third slave device 7. A description will now be given of the common sound field apparatus 100 which functions as any of the master device 3, the first slave device 5, the second slave device 6, and the third slave device 7.

As shown in FIG. 2, the common sound field apparatus 100 includes a CPU (Central Processing Unit) 10 which controls the overall operation of the common sound field apparatus 100, and a rewritable flash memory 11 which stores firmware comprised of control programs including master and slave processing routines executed by the CPU 10 and master and slave algorithms (micro-programs) executed by a signal processing section 18 thereof and operation data of six patterns each having eight variations, and a RAM (Random Access Memory) 12 which functions as a working area for the CPU 10 and into which programs and algorithms as well as operation data are loaded. In this case, if the CPU 10 executes the master processing routine to cause the signal processing section 18 to execute the master algorithm stored in the flash memory 11, and supplies master control data stored in the flash memory 11 to the signal processing section 18, the common sound field apparatus 100 functions as the master device 3. Also, if the CPU 10 executes the slave processing routine to cause the signal processing section 18 to execute the slave algorithm stored in the flash memory 11, and supplies slave control data to the signal processing section 18, the common sound field apparatus 100 functions as any of the first slave device 5, the second slave device 6, and the third slave device 7.

In the common sound field apparatuses 100 which are caused to operate as the master device 3, the first slave device 5, the second slave device 6, and the third slave device 7, respectively, the firmware and the operation data stored in the flash memory 11 are identical between the common sound field apparatuses 100. Therefore, the common sound field apparatus 100 can be caused to operate as any of the master device 3, the first slave device 5, the second slave device 6, or the third slave device 7 by copying the firmware and the operation data to the flash memory 11. Also, by rewriting the operation data in the flash memory 11, it is possible to provide sound field control for obtaining various sound field patterns.

A variety of interfaces (I/O) 13 include a personal computer interface and a MIDI I/O provides interface for connecting to the personal computer 4 as well as the MIDI machines 8*a* and 8*b*. A panel interface (I/O) 14 provides interface for connecting the control panel 2 to the common sound field apparatus 100 via GPI terminals, and allows two-way communication. A display unit 15 is comprised of lamps including an LED which indicates the ON/OFF state of power supply, and a small-sized display which indicates e.g. a designated sound field pattern number. An operator 16 is comprised of a power supply switch, a selection switch for selecting a word clock supplied from upstream and a clock generated internally, and a hidden switch for rewriting the firmware and the operation data stored in the flash memory 11. A waveform interface (I/O) 17 provides interface for sending and receiving audio signals for inputting picked-up sound signals and musical sound signals and outputting speaker signals.

The signal processing section 18 is comprised of a large number of DSPs (Digital Signal Processors), and performs signal processing on audio signals subjected to sound-field control according to an algorithm which is loaded into the RAM 12 and supplied to the signal processing section 18 under the control of the CPU 10. In this case, if the common sound field apparatus 100 functions as the master device 3, the signal processing section 18 performs processing such as generation of reflected sound signals of picked-up sound signals according to the master algorithm loaded in the RAM 12 and using the master control data. If the sound field device 100 functions as the first slave device 5, the second slave device 6, or the third slave device 7, the signal processing section 18 performs processing to adjust and mix delay times and levels of supplied reflected sound signals and sound signals for each speaker according to the slave algorithm loaded in the RAM 12 and using the slave control data. A cascade interface (I/O) 19 provides interface for connecting the common sound field apparatuses 100 in cascade to each other, and is provided with a cascade output terminal OUT and a cascade input terminal IN. It should be noted that the above-mentioned component parts can send and receive data and others to and from each other via a bus 20.

It should be noted that each of the common sound field apparatuses 100 connected in cascade determines on which stage the common sound field apparatus 100 itself is connected in cascade when power supply is turned on. This determination is carried out in initial processing performed by the CPU 10. In the common sound field apparatus 100, which is determined as being on the first stage since its cascade input terminal is free, the CPU 10 performs the master processing routine and loads the master algorithm and the master control data from the flash memory 11 into the RAM 12 so that the common sound field apparatus 100 can automatically function as the master device 3. Also, in the common sound field apparatus 100, which is determined as being on the second stage since the master device 3 is connected to its cascade input terminal, the CPU 10 performs the slave processing routine and loads the slave algorithm and the first slave control data from the flash memory 11 into the RAM 12 so that the common sound field apparatus 100 can automatically function as the first slave device 5.

Similarly, in the common sound field apparatus 100, which is determined as being on the second or third stage, the CPU 10 loads the slave algorithm and the second or third slave control data from the flash memory 11 into the RAM 12 so that the common sound field apparatus 100 can automatically function as the second slave device 6 or the third slave device 7. Here, the stage on which each common sound field apparatus 100 is connected in cascade can be determined based on numerical value data received by the common sound field apparatus 100; i.e. the common sound field apparatus 100 whose cascade input terminal is free sets a predetermined initial value as the numerical value data, and each of the common sound field apparatuses 100 connected downstream increments the numerical value data received from its upstream common sound field apparatus 100 and sequentially transfers the incremented numeral value data downstream.

As described above, the sound field control apparatus 1 comprised of the master device 3, the first slave device 5, the second slave device 6, and the third slave device 7 can be constructed only by connecting in cascade the common sound field apparatuses 100, which are identical in hardware construction and provided with the same firmware and the same operation data. Therefore, even in the case where the sound field control apparatus 1 is comprised of a combination of master and slave devices having different functions, when any of the master device or the slave devices fails, the failure can be coped with by replacing the failed master or slave device with an alternative common sound field apparatus 100 prepared in advance for reserve, because the master device and the slave devices are all implemented by the common sound field apparatuses 100.

Figure 3:
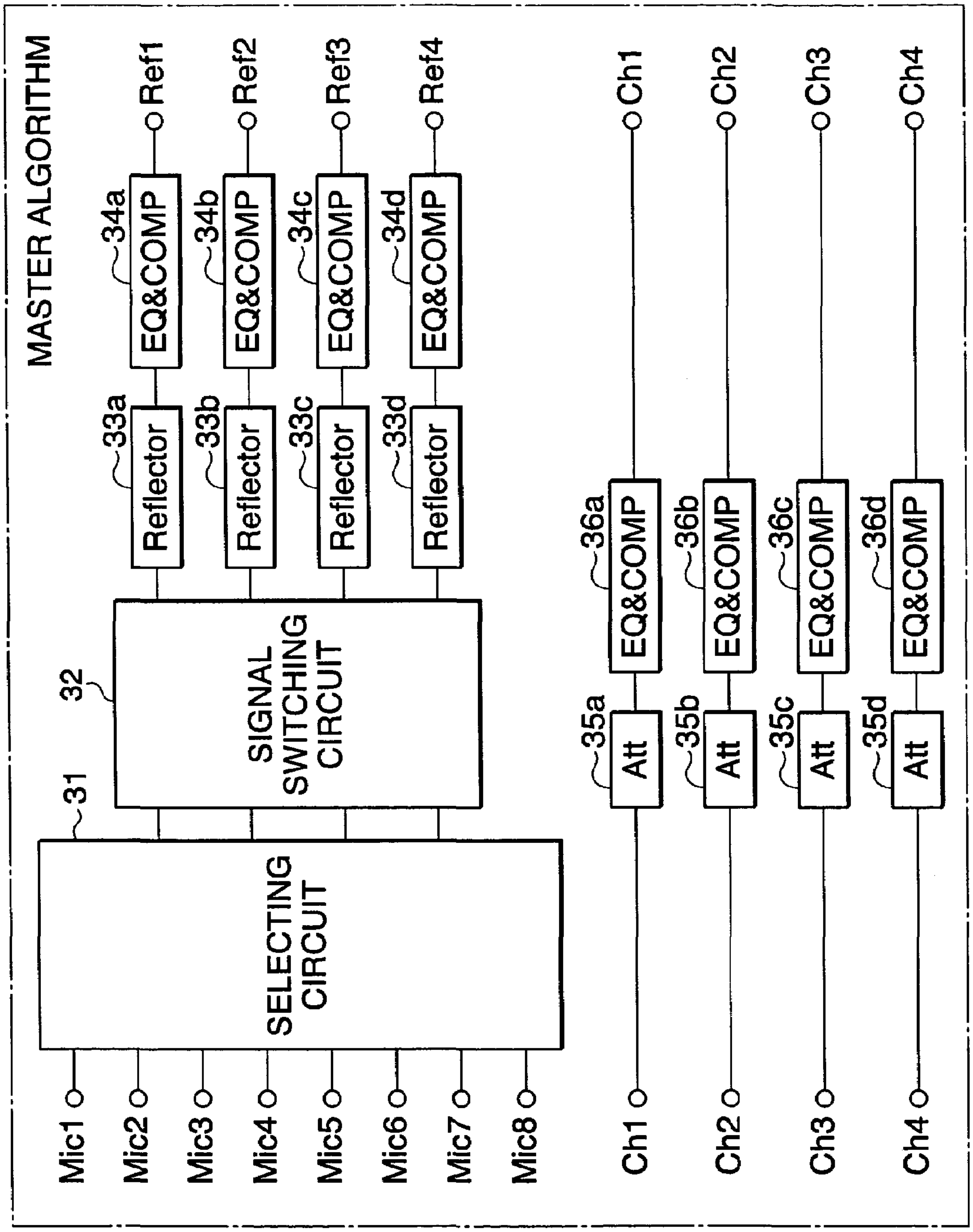
FIG. 3 is a diagram showing a master algorithm which is executed by the common sound field apparatus shown in FIG. 2.

FIG. 3 shows the master algorithm which is executed by the common sound field apparatus 100 functioning as the master device 3.

According to the master algorithm, eight sound pick-up microphones Mic 1 to Mic 8 can be assigned, and picked-up sound signals assigned to the microphones Mic 1 to Mic 8 among input audio signals are input to a selecting circuit 31. The selecting circuit 31 combines the picked-up sound signals from the Mic 1 to Mic 8 and outputs the combined signal to four systems. Output picked-up sound signals from the four systems are supplied to reflectors 33*a*, 33*b*, 33*c*, and 33*d*, via a signal switching circuit 32 which periodically switches the four systems in a circulating manner. The reflectors 33*a*, 33*b*, 33*c*, and 33*d* can be implemented by FIR (Finite Impulse Response) filters whose tap positions vary on a time base, and the master control data is used as the switching period of the signal switching circuit 32 and the coefficients of the FIR filters to generate reflected sound signals suitable for a space where the sound field control apparatus 1 is installed. It should be noted that the periodic switching of the signal switching circuit 32 and the variation of tap positions of the FIR filters are intended to reduce the coloration of reverberation and the expansion of the howling margin. The generated reflected sound signals are supplied to equalizers and compressors (EQ & COMP) 34*a*, 34*b*, 34*c*, and 34*d*, which finely adjust the delay time, frequency characteristics, and vibration characteristics of the reflected sound signals and output the resulting signals as four-system reflected sound outputs Ref1, Ref2, Ref3, and Ref4.

Further, audio signals input for broadcasting can be assigned to four channels Ch1, Ch2, Ch3, and Ch4. The audio signals assigned to the channels Ch1, Ch2, Ch3, and Ch4 can be music signals for music desired to be played as BGM or human's announcement speech signals picked up by microphones. The audio signals assigned to the channels Ch1, Ch2, Ch3, and Ch4 are such signals that no reflected signals are generated from the audio signals. Specifically, the audio signals assigned to the channels Ch1, Ch2, Ch3, and Ch4 are adjusted in level by attenuators (Att) 35*a*, 35*b*, 35*c*, and 35*d* and then supplied to equalizers and compressors (EQ & COMP) 36*a*, 36*b*, 36*c*, and 36*d*, so that the frequency characteristics and vibration characteristics of the audio signals are finely adjusted and output as four-channel outputs. The four-channel outputs as well as the four-system reflected sound outputs Ref1, Ref2, Ref3, and Ref4 are output as audio signals from the cascade output terminal OUT.

Figure 4:
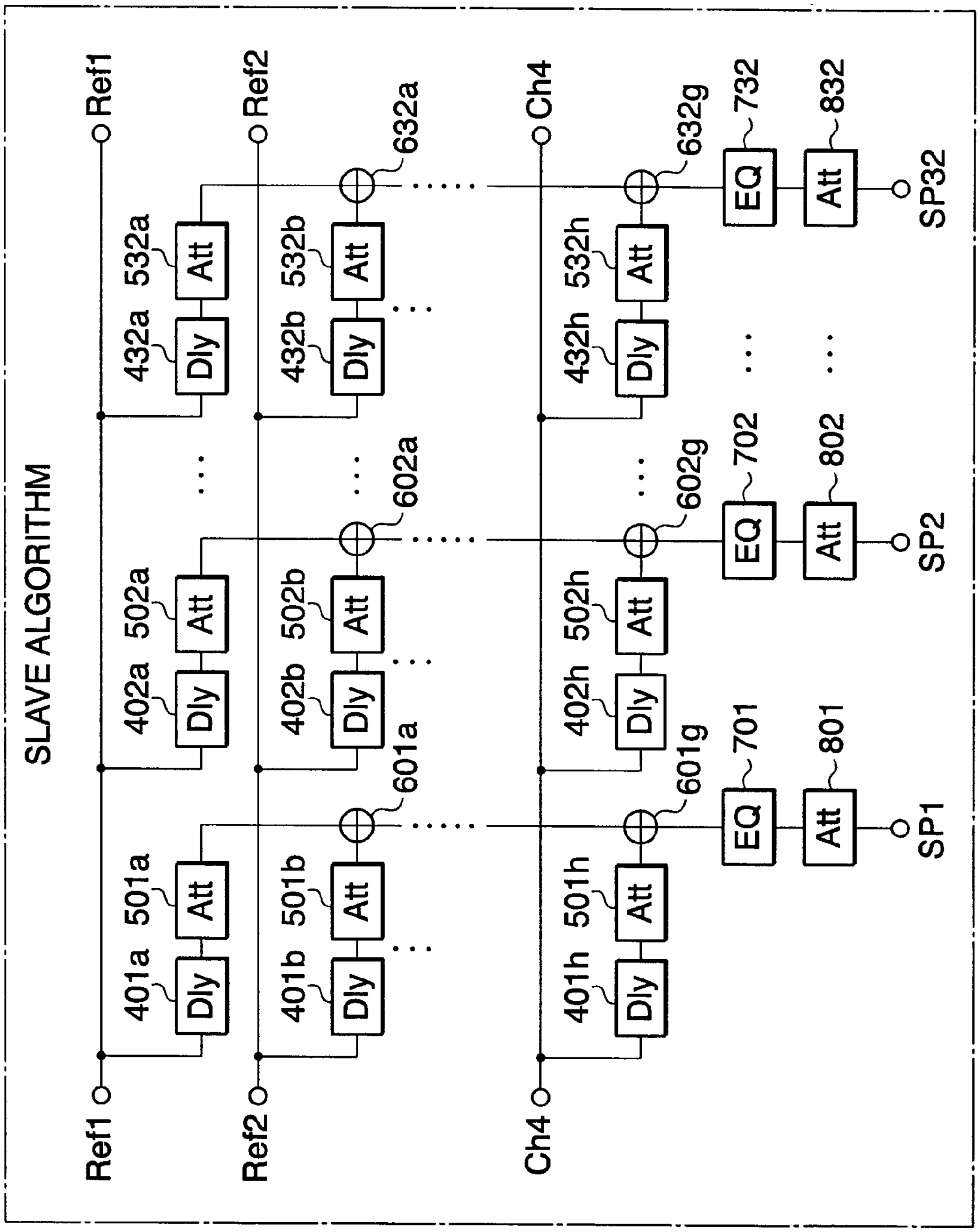
FIG. 4 is a diagram showing a slave algorithm which is executed by the common sound field apparatus.

FIG. 4 shows the slave algorithm which is executed by the common sound field apparatus 100 functioning as any of the first slave device 5, the second slave device 6, and the third slave device 7.

According to the slave algorithm, the four-system reflected sound outputs Ref1, Ref2, Ref3, and Ref4 and the four-channel outputs Ch1, Ch2, Ch3, and Ch4 are input through the cascade input terminal IN. The input eight signals are directly output from the cascade output terminal OUT and adjusted in delay time and level and mixed to generate outputs SP1, SP2, . . . , and SP32 for the first to thirty-second speakers. For example, the output SP1 for the first speaker is output after the input eight signals are adjusted in delay time by delay devices (Dly) 401*a* to 401*h*, and then adjusted in level by attenuators (Att) 501*a* to 501*h*. The adjusted eight signals are added together by adders 601*a* to 601g, and the resulting signal is adjusted in frequency characteristics by an equalizer (EQ) 701 and adjusted in level by an attenuator (Att) 801 to generate the output SP1. In this case, if the common sound field apparatus 100 is on the second stage, the delay times of the delay devices (Dly) 401*a* to 401*h*, the attenuation levels of the attenuators (Att) 501*a* to 501*h* and the attenuator (Att) 801 and the coefficient of the equalizer (EQ) 701 are set using the first slave control data, and if the common sound field apparatus 100 is on the third or fourth stage, the delay times of the delay devices (Dly) 401*a* to 401*h*, the attenuation levels of the attenuators (Att) 501*a* to 501*h* and the attenuator (Att) 801 and the coefficient of the equalizer (EQ) 701 are set using the second or third slave control data.

Further, the output SP2 for the second speaker is output after the input eight signals are adjusted in delay time by Dly 402*a* to 402*h*, and then adjusted in level by attenuators (Att) 501*a* to 501*h*. The adjusted eight signals are added together by adders 602*a* to 602*g*, and the resulting signal is adjusted in frequency characteristics by an EQ 702 and adjusted in level by an Att 802 to generate the output SP2. Furthermore, the output SP32 for the thirty-second speaker is output after the input eight signals are adjusted in delay time by Dly 432*a* to 432*h*, and then adjusted in level by Att 532*a* to 532*h*. The adjusted eight signals are added together by adders 632*a* to 632*g*, and the resulting signal is adjusted in frequency characteristics by an EQ 732 and adjusted in level by an Att 832 to generate the output SP32.

In this case, if the common sound field apparatus 100 is on the second stage, the delay times of the Dly 401*a* to 401*h*, the Dly 402*a* to 402*h*, and the Dly 432*a* to 432*h*, the attenuation levels of the Att 501*a* to 501*h*, the Att 502*a* to 502*h*, and the Att 532*a* to 532*h*, the coefficient of the equalizer EQ 701 to 732, and the attenuation levels of the Att 801 to 832 are set using the first slave control data, and if the common sound field apparatus 100 is on the third or fourth stage, the delay times of the Dly 401*a* to 401*h*, the Dly 402*a* to 402*h*, and the Dly 432*a* to 432*h*, the attenuation levels of the Att 501*a* to 501*h*, the Att 502*a* to 502*h*, and the Att 532*a* to 532*h*, the coefficient of the equalizer EQ 701 to 732, and the attenuation levels of the Att 801 to 832 are set using the second or third slave control data.

Figure 5:
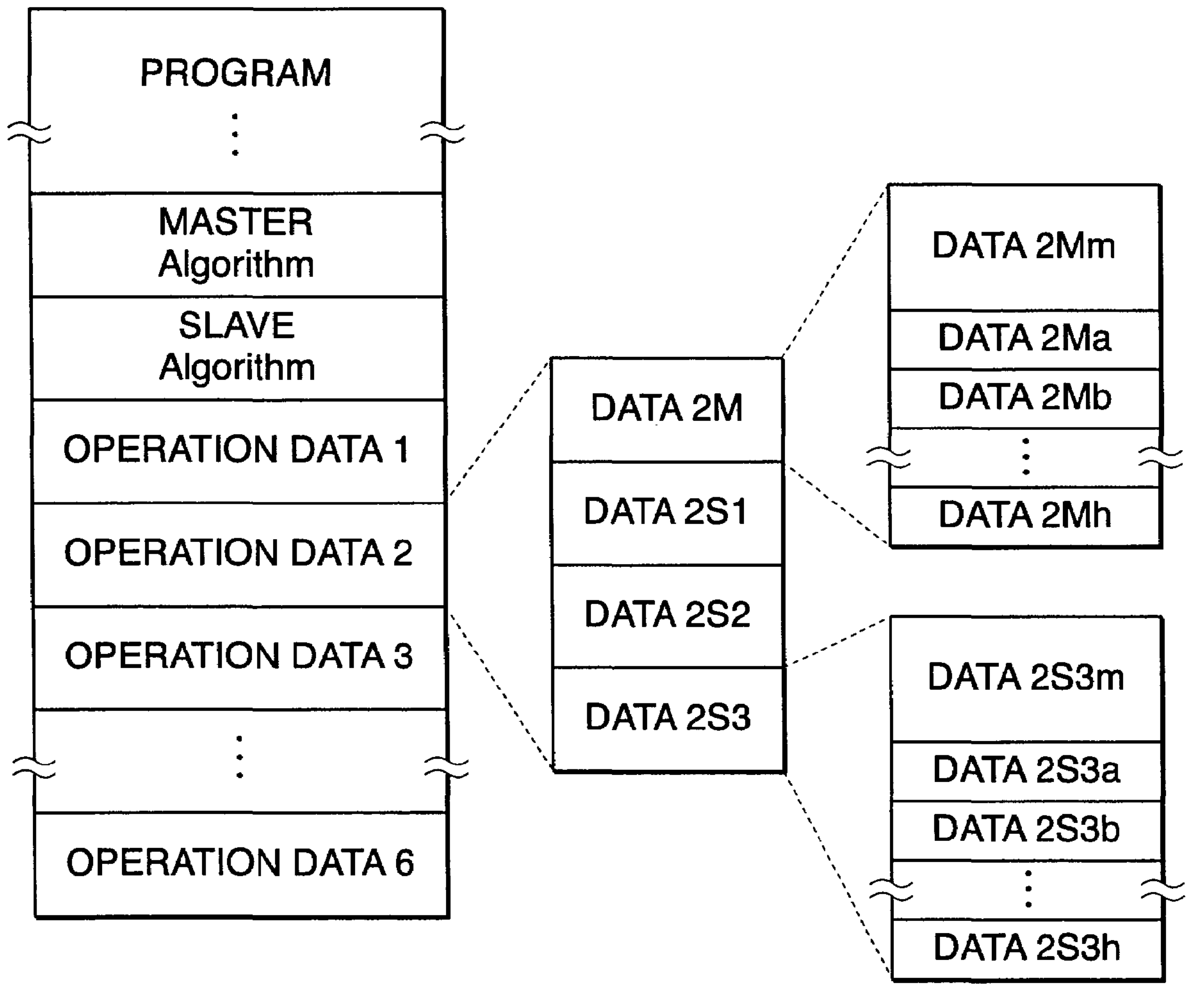
FIG. 5 is a diagram showing the structure of data stored in the common sound field apparatus.

FIG. 5 shows an example of the structure of data stored in the flash memory 11 in the case where the sound field control apparatus in FIG. 1 is comprised of four common sound field apparatuses 100 in FIG. 2.

The flash memory 11 stores control programs including the master and slave processing routines the firmware comprised of the master algorithm and the slave algorithm, and the operation data 1 to 6. Each of the operation data 1 to 6 is intended to obtain six sound field patterns which can be selected using the pattern switches 2*b* of the control panel 2. Various parameter values of each of the operation data 1 to 6 are different according to the sound field pattern to be obtained, but the operation data 1 to 6 have the same data structure. A description will now be given of the data structure of the operation data 2, for example. As shown in FIG. 5, the operation data 2 is comprised of master control data 2M for the master device 3, slave control data 2S1 for the first slave, slave control data 2S2 for the second slave, and slave control data 2S3 for the third slave.

As shown in FIG. 5, the master control data 2M for the master device 3 is comprised of master main data 2Mm for a sound field pattern 2 and sub data 2Ma, 2Mb, . . . , 2Mh for eight livenesses thereof. The sub data 2Ma, 2Mb, 2Mh are differential data, which are selectively added to the main data 2Mm to become operation data indicative of the respective livenesses thereof. The slave control data 2S1 for the first slave, the slave control data 2S2 for the second slave, and the slave control data 2S3 for the third slave have the same data structure. FIG. 5 shows the data structure of the slave control data 2S3 for the third slave, for example. The slave control data 2S3 for the third slave is comprised of main data 2S3*m* for the third slave for the sound field pattern 2 and sub data 2S3*a*, 2S3*b*, . . . , and 2S3*h* for eight livenesses thereof. The sub data 2S3*a*, 2S3*b*, . . . , and 2S3*h* are differential data, which are selectively added to the main data 2S3*m* to become operation data indicative of the respective livenesses thereof.

Figure 6:
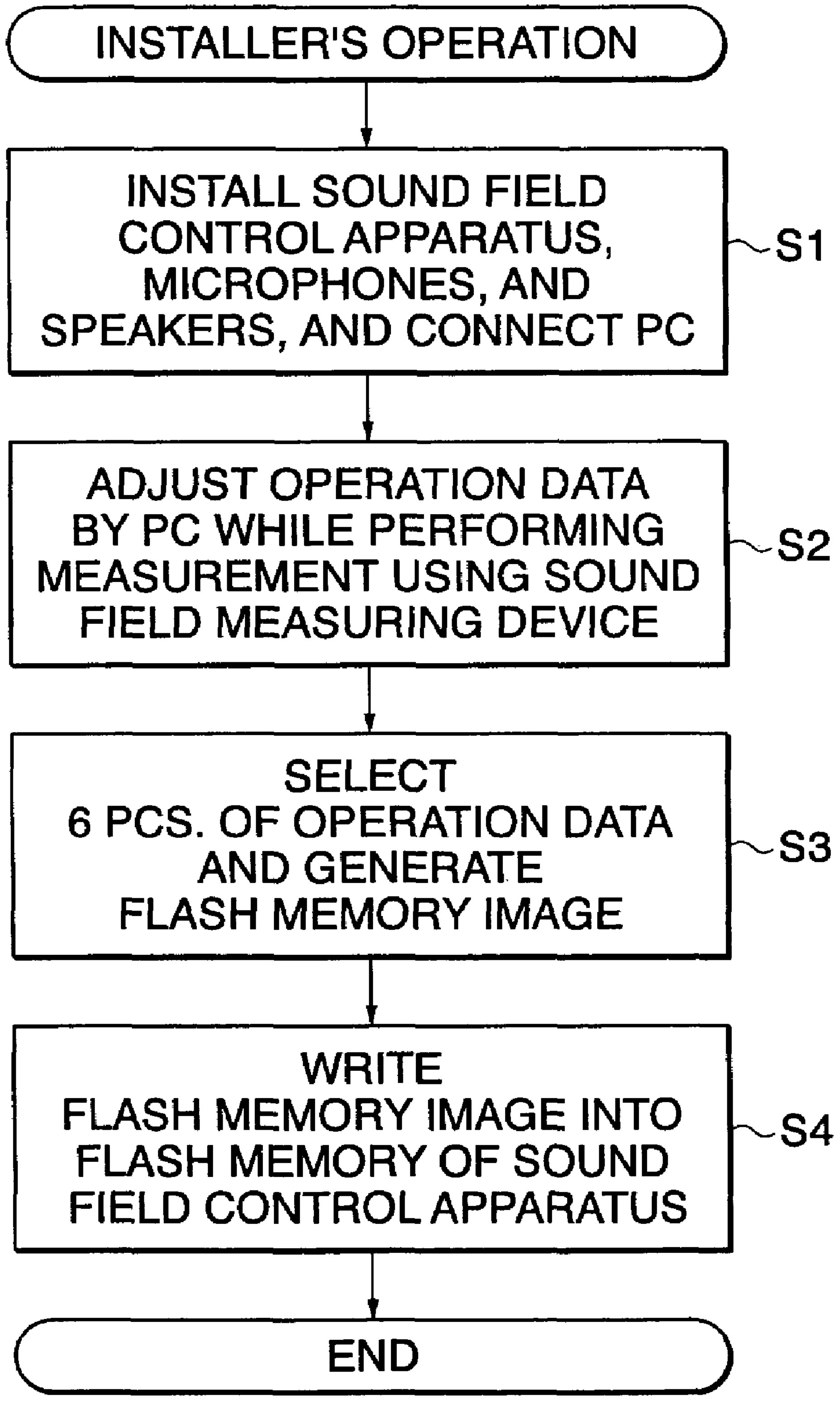
FIG. 6 is a flow chart showing an operation which is carried out by an installer who installs the sound field control apparatus comprised of the common sound field apparatus.

As stated above, when installing the sound field control apparatus 1, operation data to be set in a plurality of common sound field apparatuses 100 constituting the sound field control apparatus 1 is adjusted according to a space where the sound field control apparatus 1 is installed by an installer so that plural pieces of (six in the present embodiment) operation data suitable for the space are stored in the flash memory 11. FIG. 6 is a flow chart showing an operation carried out by the installer on this occasion.

As shown in FIG. 6, in a step S1 of the operation carried out by the installer, a plurality of common sound field apparatuses 100 constituting the sound field control apparatus 1 are installed and connected in cascade to each other, and the control panel 2 is GPI-connected to the first stage common sound field apparatus 100. Also, a plurality of microphones and a plurality of speakers are installed on the ceiling, walls, etc. of a hall or a room subjected to sound field control, and the microphones are connected to the input of the master device 3 as the first stage sound field device 100, and the speakers are distributed to be connected to the outputs of the first slave devices 5 and subsequent slave devices as the second and subsequent stage common sound field apparatuses 100. In this case, the number of speakers can be increased according to the number of slave devices connected in cascade. Then, to adjust operation data to be set in the master device 3 and the first slave device 5 and the subsequent slave devices, the personal computer (PC) 4 is connected to the master device 3 as the first stage common sound field control apparatus 100, and a control application for the sound field control apparatus 1 is started in the personal computer 4. It should be noted that predetermined operation data may be stored in advance in the master device 3 and the first slave device 5 and the subsequent slave devices.

Then, in a step S2, the sound field control apparatus 1 is operated to measure sound characteristics such as delay time and sound pressure of reverberation sounds of the hall or room using the sound field measuring device, while the operation data is adjusted in accordance with the control application in the personal computer 4 so that desired measured values can be obtained. With the operation data having been adjusted, test music is played, or a performer is caused to play a piece of test music with a musical instrument, and then it is determined whether the operation data has been adjusted to become suitable for the space. Here, the personal computer 4 is capable of storing an arbitrary number of pieces of adjusted operation data in its mass storage, and hence, for example, operation data considered suitable for the space is selected from among a large number of pieces of operation data created in the past at a different location, and the selected operation data as initial data is sequentially adjusted. Further, since operation data for six sound field patterns is finally required in the illustrated embodiment, six or more pieces of operation data suitable for the space are created and stored in the large capacity storage of the personal computer 4 in the step S2. Then, in a step S3, operation data for six sound field patterns, which are considered particularly suitable for the space, is selected from the plural pieces of operation data suitable for the space, and a flash memory image including the selected operation data is created. Then, the created flash memory image is written into the flash memories 11 of the common sound field apparatuses 100 functioning as the master device 3, the first slave device 5, and the subsequent slave devices. Therefore, when sound field patterns are switched using the pattern switches 2*b* on the control panel 2, the selected sound field pattern can be obtained by the sound field control apparatus 1.

Figure 7:
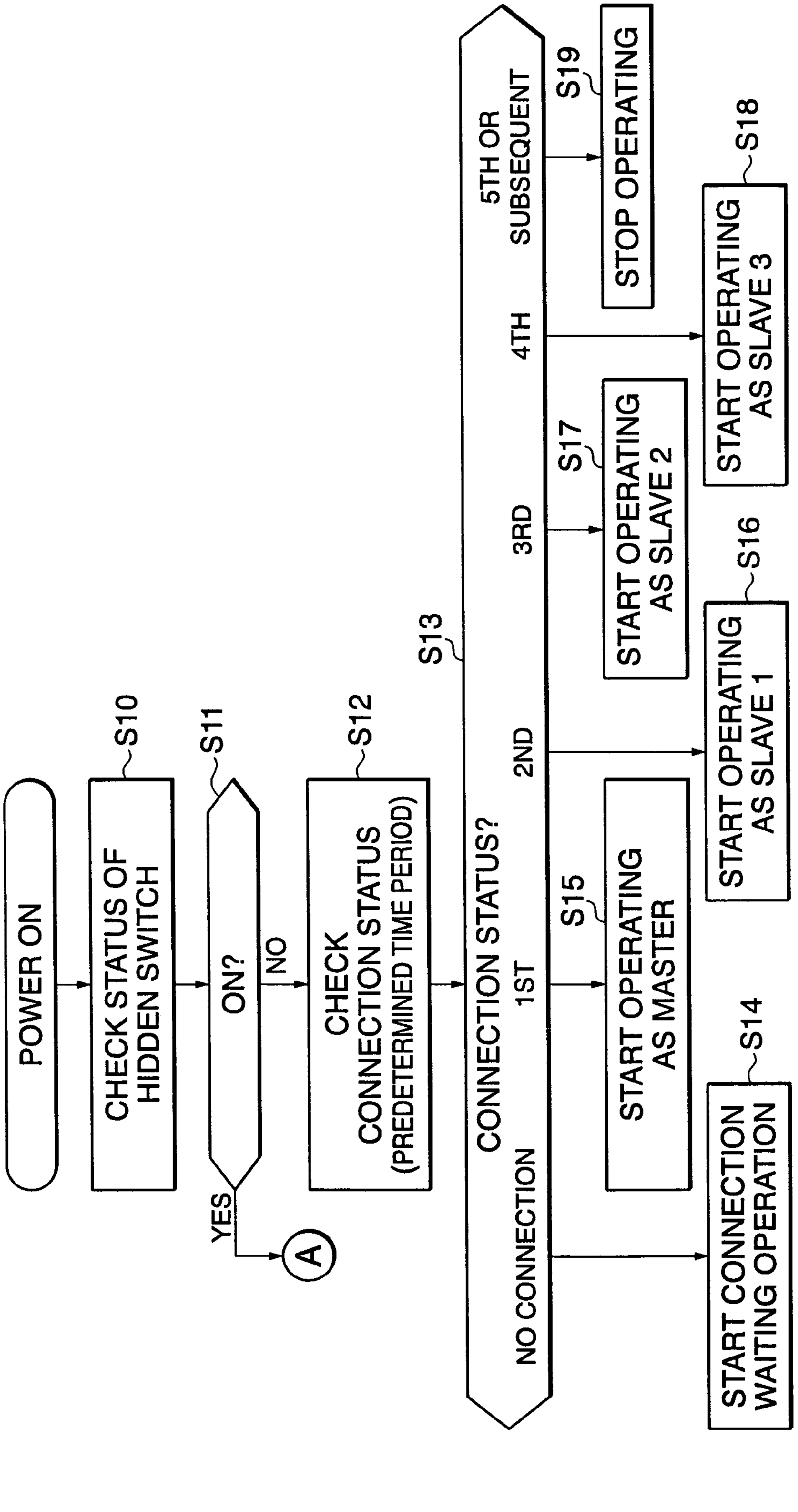

FIG. 7 is a flow chart showing an operation which is executed when power supply of the common sound field apparatus 100 constituting the sound field control apparatus 1 is turned on.

When a power supply switch of the common sound field apparatus 100 is turned on, the status of the hidden switch is checked in a step S10. If it is determined that the hidden switch is on, the process branches to a process shown in FIGS. 8A and 8B in a step S11, and if the hidden switch is off, the process proceeds from the step S11 to a step S12. In the step S12, it is checked on which stage the common sound field apparatus 100 itself is connected in cascade. In this case, the connection status is checked for a predetermined period of time so as to correctly recognize the connection status even if power supplies of a plurality of common sound field apparatuses 100 connected in cascade are turned on in slightly different timing. The result of the connection status checking is obtained upon the lapse of the predetermined period of time, and in a step S13, the process branches according to the result.

If the result of the connection status checking in the step S13 is "no connection", the process branches to a step S14 where a connection waiting operation in which it is awaited that another common sound field apparatus 100 is connected or power supply thereof is turned on. During this operation, if the connection of any common sound field apparatus 100 to the concerned common sound field apparatus 100 is detected, the process jumps to the step S12 where the connection status is checked. If it is determined in the step S13 that the sound field device 100 is on the first stage, the process branches to a step S15 where the common sound field apparatus 100 starts operating as the master device 3. Specifically, by executing the master processing routine included in the control programs, the master algorithm and operation data (e.g. operation data 2) are read out from the flash memory 11 and loaded into the RAM 12, and master control data (e.g. control data 2M) included in the operation data is supplied to the signal processing section 18, so that the common sound field apparatus 100 operates as the master device 3. Here, in accordance with the master processing routine, communication with the control panel connected to the concerned common sound field apparatus 100 (including the switching of patterns and variations according to control signals supplied from the GPI terminals), communication with the MIDI machines connected to the concerned common sound field apparatus 100, communication with the personal computer 4 connected to the concerned common sound field apparatus 100 (including the edition of operation data according to control signals from the control application), communication with the first slave device 5 connected to the concerned sound field device 100 (including the transfer of control signals from the control application, the GPI terminals, and so forth, and sound signals and word clocks from the signal processing section 18), and so forth are carried out as well as control provided by the signal processing section 18

Further, if it is determined in the step S13 that the common sound field apparatus 100 is on the second stage, the process branches to a step S16 where the common sound field apparatus 100 starts operating as the first slave device 5. Specifically, by executing the slave processing routine included in the control programs, the slave algorithm and operation data are read out from the flash memory 11 and loaded into the RAM 12, and slave control data (e.g. control data 2S1) included in the operation data is supplied to the signal processing section 18, so that the common sound field apparatus 100 operates as the first slave device 5. Here, in accordance with the slave processing routine, communication with the master device 3 connected to the concerned common sound field apparatus 100 (including the edition of operation data according to the control signals from the control application, and the switching of patterns and variations according to control signals supplied from the GPI terminals), communication with the second slave device 6 connected to the concerned sound field device 100 (including the transfer of control signals from the control applications, the GPI terminals, and so forth, and sound signals and word clocks from the signal processing section 18), and so forth are carried out as well as control provided by the signal processing section 18.

Further, if it is determined in the step S13 that the common sound field apparatus 100 is on the third stage, the process branches to a step S17 where the common sound field apparatus 100 starts operating as the second slave device 6. Specifically, by executing the slave processing routine included in the control programs, the slave algorithm and operation data are read out from the flash memory 11 and loaded into the RAM 12, and slave control data (e.g. control data 2S2) included in the operation data is supplied to the signal processing section 18, so that the common sound field apparatus 100 operates as the second slave device 6. Further, if it is determined in the step S13 that the common sound field apparatus 100 is on the fourth stage, the process branches to a step S18 where the common sound field apparatus 100 starts operating as the third slave device 7. Specifically, by executing the slave processing routine included in the control programs, the common sound field apparatus 100 operates as the third slave device 7 in the same manner as described above. Further, if it is determined in the step S13 that the common sound field apparatus 100 is on the fifth stage, the process branches to a step S19 where the common sound field apparatus 100 is caused to stop operating. This is because the sound field control apparatus 1 according to the illustrated embodiment is designed such that up to four common sound field apparatuses 100 can be connected in cascade, but the sound field control apparatus 1 may be designed such that five or more common sound field apparatuses 100 can be connected in cascade, or such that up to three common sound field apparatus 100 can be connected in cascade.

Figure 8A:
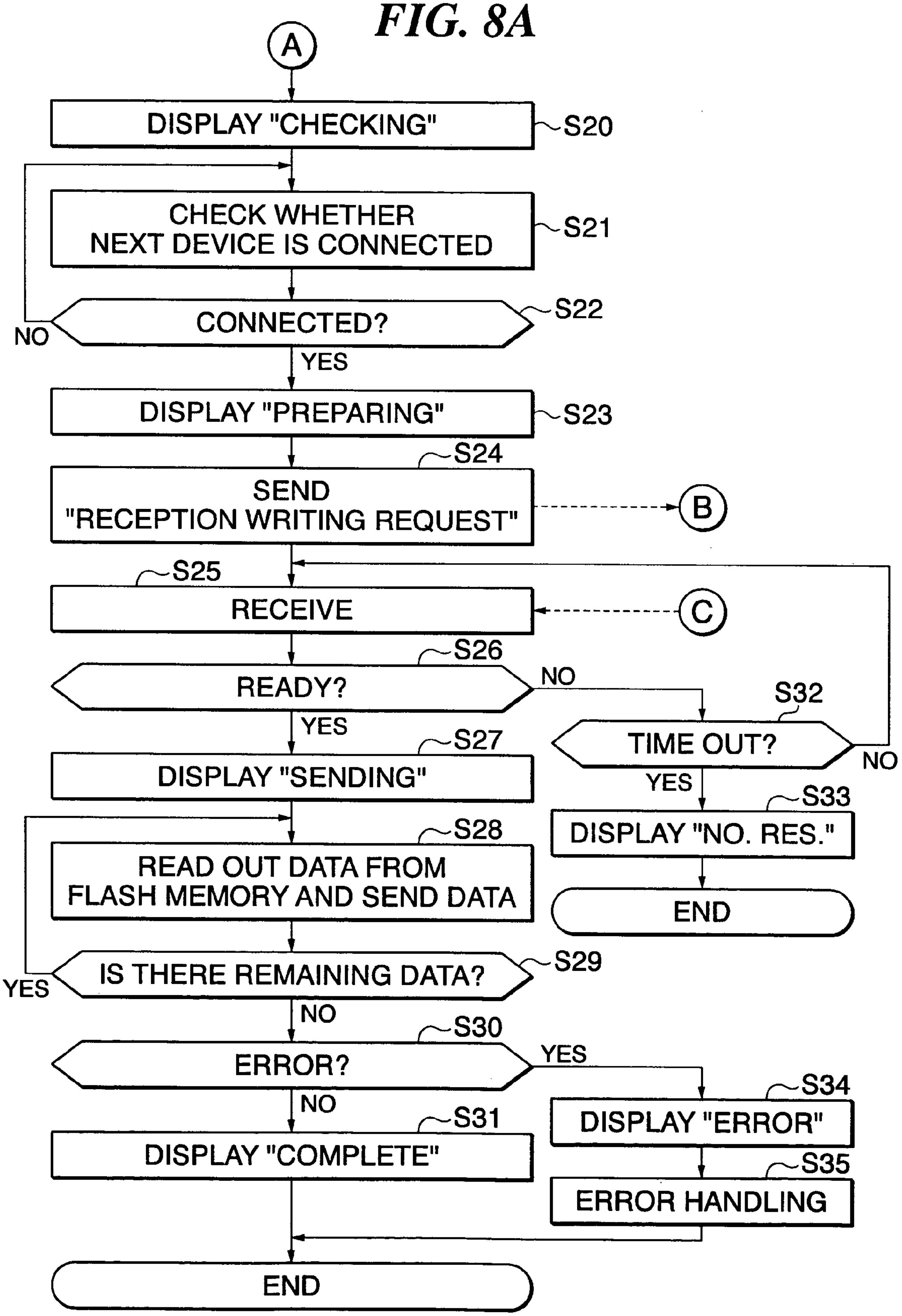
FIGS. 8A and 8B are flow chart showing a process which is executed when the common sound field apparatus copies data.

On the other hand, if it is determined in the step S11 that the hidden switch is on, as a result of the check in the step S10, the process branches to a step S20 in FIG. 8A. It should be noted that firmware and operation data stored in the flash memory 11 of the common sound field apparatus 100 whose hidden switch has been turned on can be written into the flash memories 11 of downstream common sound field apparatuses 100 connected in cascade. Therefore, it is checked in the step S20 whether or not any other common sound field apparatus 100 is connected downstream, and during the checking, a message "Checking" is displayed on the display unit 15. When the checking is completed, the process proceeds to a step S22. If it is determined that any other common sound field apparatus 100 is connected, the process proceeds to a step S23, and if no other common sound field apparatus 100 is connected, the process returns to the step S21, so that the steps S21 and S22 are repeatedly executed until a connection with any other common sound field apparatus 100 is established. In the step S23 executed in the case where any other common sound field apparatus 100 is connected downstream, a message "Preparing" is displayed on the display unit 15, and then, in a step S24, a "reception writing request" is transmitted to the common sound field apparatus 100 connected downstream.

Figure 8B:
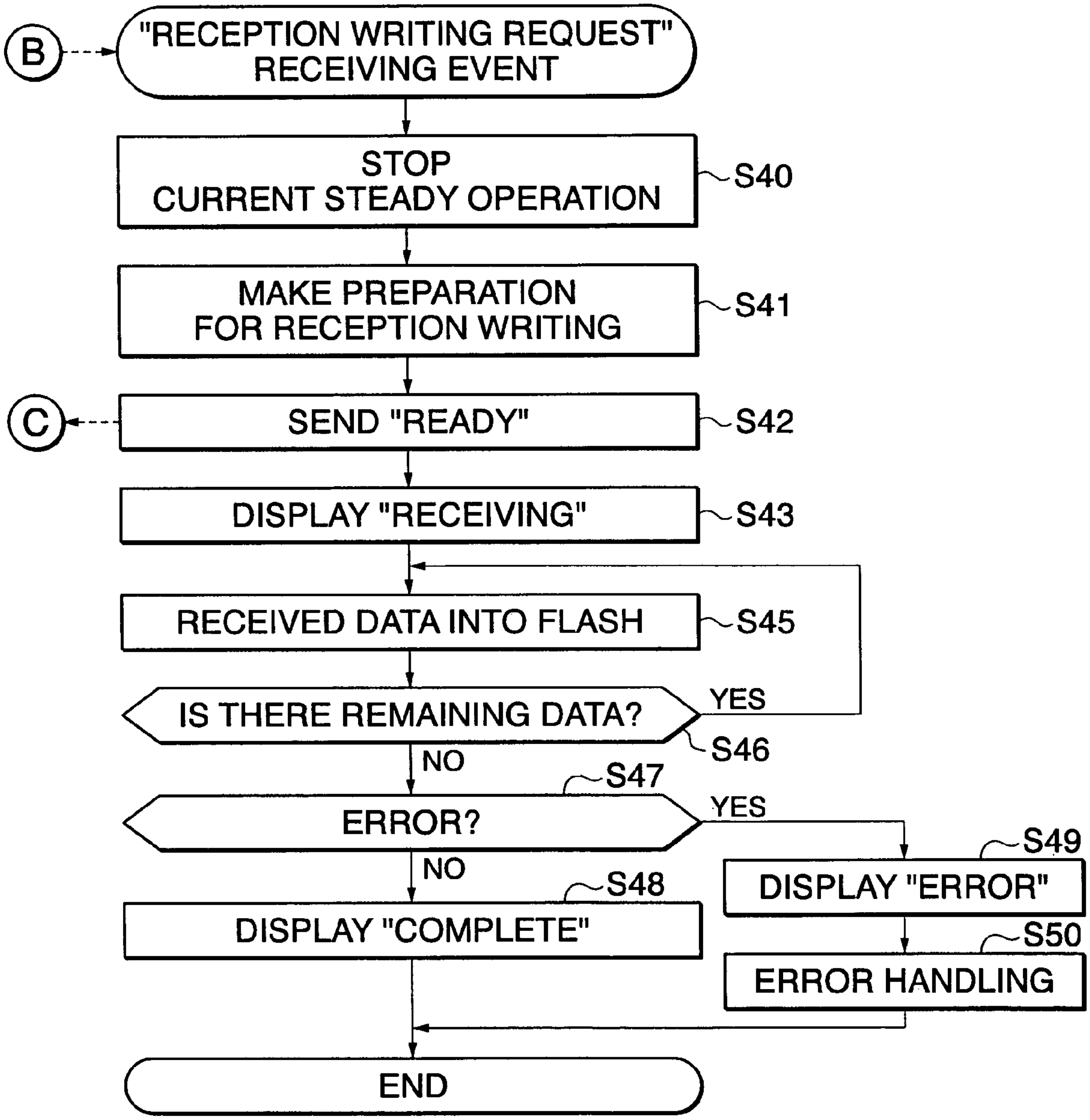

The downstream common sound field apparatus 100 which has received the transmitted "reception writing request" performs "reception writing request" reception event processing in the flow chart of FIG. 8B. Specifically, in a step S40, a steady operation which is currently carried out is stopped, and in a step S41, preparation is performed for reception writing. In this preparation, part of the contents stored in the flash memory 11 (for example, a reception writing routine) is saved in the RAM 12. Upon completion of the preparation, a signal "Ready" indicative of the completion of the preparation for reception writing is sent to the upstream common sound field apparatus 100 in a step S42. On the other hand, in a step S25, the upstream common sound field apparatus 100 performs processing on signals received from the downstream common sound field apparatus 100, and if it is determined that the signal "Ready" has been received, the process proceeds to a step S27. If it is determined that the signal "Ready" has not been received, the process branches to a step S32 where a timer is started, and the process returns to the step S25 where reception processing is repeatedly carried out until the signal "Ready" is received before a predetermined period of time passes. If the signal "Ready" is not received before the predetermined period of time passes, the process proceeds from the step S32 to a step S33 where a message "No. Res" indicating that there has been no response is displayed on the display unit 15, and the process is terminated.

On the other hand, if the signal "Ready" is received before the predetermined period of time passes, the process proceeds from the step S26 to the step S27 where a message "Sending" indicating that data is being transmitted is displayed on the display unit 15. Then, in a step S28, a predetermined unit amount of data to be sent, which is stored in the flash memory 11 and has the data structure shown in FIG. 5 is read out and packetized, and the resulting packet is sent to the downstream common sound field apparatus 100. Then, in a step S29, it is determined whether or not there is remaining data to be sent, and if there is remaining data to be sent, the process returns to the step S28. By repeated execution of the steps S28 and S29 as above, packets comprised of predetermined unit amounts of data are sequentially sent to the downstream common sound field apparatus 100. Upon completion of the transmission of all the data, the process proceeds from the step S29 to a step S30 where it is determined whether an error has occurred or not.

It is determined that an error has occurred, for example, when the communication with the downstream common sound field apparatus 100 has been interrupted, a notification of receipt from the downstream common sound field apparatus 100 in response to a sent packet is lost, or an error is detected in data received by the downstream common sound field apparatus 100 although all the notifications of receipt are returned. If it is determined in the step S30 that an error has occurred, the process proceeds to a step S34 where a message "Error" indicative of the occurrence of the error is displayed on the display unit 15, and in a step S35, error handling (such as error content analysis and display) is carried out, and the process is terminated. On the other hand, if it is determined in the step S30 that no error has occurred, the process proceeds to a step S31 where a message "Complete" indicating that data has been normally sent is displayed on the display unit 15, and the process is terminated.

Further, in the downstream common sound field apparatus 100, after the signal "Ready" is sent to the upstream common sound field apparatus 100 in the step S42, the process proceeds to a step S43 where a message "Receiving" indicating that data is being received is displayed on the display 15. Then, in a step S45, the received data is written into the flash memory 11. It is determined in a step S46 whether or not there is remaining data to be received, and if there is remaining data to be received, the process returns to the step S45 where data is repeatedly received and written into the flash memory 11. If all the data to be received has been received, the process proceeds from the step S46 to a step S47 where it is determined whether an error has occurred or not. If it is determined in the step S47 that an error has occurred, the process proceeds to a step S49 where a message "Error" indicative of the occurrence of the error is displayed on the display 15, and in a step S50, error handling is carried out. In the error handling, for example, a reception writing routine is written from the RAM 12 into the flash memory 11, so that when power supply is turned on next time, reception writing processing in which received data is written can be performed. Then, the processing on the "reception writing request" receiving event is terminated. On the other hand, if it is determined in the step S47 that an error has not occurred, the process proceeds to a step S48 where a message "Complete" indicating that the data has been normally received is displayed on the display unit 15, and the "reception writing request" receiving event processing is terminated.

By the way, when any of the master device 3, first slave device 5, second slave device 6, and third slave device 7 of the sound field control apparatus 1 fails, the failed device can be replaced by a new common sound field apparatus 100 as stated above, but only by replacement of the failed device with a new common sound field apparatus 100, the new common sound field apparatus 100 cannot properly operate since the version of firmware stored in the flash memory of the new common sound field apparatus 100 is different from the version of the other common sound field apparatuses 100 of the sound field control apparatus 1, or since operation data stored in the flash memory of the new common sound field apparatus 100 is not control data suitable for the space. To address this problem, according to the prior art, operation data adjusted during installation for the purpose of recovery from a failure is backed up, and in the event of a failure, the backed-up operation data is written into the flash memory of a new common sound field apparatus 100 which has replaced the failed common sound field apparatus 100. Therefore, a personal computer is required to write backed-up operation data when the sound field control apparatus 1 fails, and the personal computer in which the backed-up operation data is stored must be carried to the place of the failure. According to the sound field control apparatus 1 of the present invention, however, firmware and operation data can be collectively copied from an upstream common sound field apparatus 100 to a downstream common sound field apparatus 100, and therefore, when any of common sound field apparatuses 100 constituting the sound field control apparatus 1 fails, firmware and operation data are collectively copied to a new common sound field apparatus 100 which replaces the failed common sound field apparatus 100, so that the sound field control apparatus 1 can be immediately returned to a normal operation.

Although in the above described embodiment, the sound field control apparatus is configured such that a plurality of common sound field apparatuses are connected in cascade, but may be configured such that a plurality of common sound field apparatuses are connected to each other via a communication means which allows two-way communication. Further, although in the above described embodiment, the sound field control apparatus is comprised of four common sound field apparatuses connected to each other, but may be comprised of two or three common sound field apparatuses if they are connected to each other via a communication means which allows two-way communication. Further, the sound field control apparatus according to the present invention may be comprised of four or more common sound field apparatuses connected to each other via a communication means which allows two-way communication. In this case, the more the number of the common sound field apparatus, the more the number of outputs of the sound field control apparatus.

Further, although in the above described embodiment, firmware and operation data are collectively copied from an upstream common sound field apparatus to a downstream common sound field apparatus, the present invention is not limited to this, but firmware and operation data may be separately copied from an upstream common sound field apparatus to a downstream common sound field apparatus. Thus, it is possible to enable common sound field apparatuses to operate by copying only operation data to a common sound field apparatus in which firmware is stored in advance. Also, the version of firmware can be upgraded only by copying the firmware.

Although in the above described sound field control apparatus according to the present embodiment, the master device 3, the first slave device 5, the second slave device 6, and the third slave device 7 are operated according to the order of physical connection of common sound field apparatuses 100 connected in cascade, but may be operated according to the order of logical connection of common sound field apparatuses 100. As described above, the cascade connection enables two-way communication of various data, and hence the master device 3 can operate whichever of the common sound field apparatuses 100 is used as the master device 3. Further, a plurality of common sound field apparatuses may be connected to a network which can address various devices conforming to Ethernet, IEEE 1394, and the like, and an arbitrary one of the connected plurality of common sound field apparatuses may be set as a master device, another one as a first stage slave device, and still another one as a second stage slave device, and so forth. In this case, waveform signals such as reflected sound signals may be transferred from one common sound field apparatus to another via the network to which the common sound field apparatuses are connected, or via an equivalent network which is separately provided. In this case, the stage on which each common sound field apparatuses is connected in cascade is set by the user.

Further, although in the above described embodiment, processing is performed on four broadcasting channels Ch1, Ch2, Ch3, and Ch4 using a resource which is required for sound field control among resources (such as sound signal input/output capability and signal processing capability) of the common sound field apparatus 100 but is not actually used for performing sound field control, but the processing on the broadcasting channels using such resource which is not used for performing sound field control but is related to sound field control should not necessarily be performed.

Furthermore, although in the above described embodiment, sound field control data is selected from among operation data of six patterns each of which has eight variations according to a designating signal and a selection signal, the present invention is not limited to this. For example, data as well as variations may be selected according to only a pattern designating signal. Alternatively, each piece of operation data may be comprised of data which includes only a single variation (i.e. data with no variation). Further, the number of patterns and the number of variations should not be limited to six and eight, respectively, but may be arbitrarily set.

Further, although in the above described embodiment, firmware and operation data are copied from one common sound field apparatus 100 to another according to the status of the hidden switch when power supply is turned on, the present invention is not limited to this. For example, firmware and operation data may be copied from one common sound field apparatus 100 to another in arbitrary timing instead of the timing of power supply being started, or in response to simultaneous or sequential operation of particular switches instead of turning-on of the hidden switch. This is convenient because firmware and operation data can be copied from one common sound field apparatus 100 to another even if the user does not have MIDI machines, personal computers, or the like at hand. Also, firmware and operation data are copied from one common sound field apparatus 100 to another according to a copying instruction from any MIDI machine and the personal computer 4 connected to the one common sound field apparatus 100 via the interface 13.

Further, in the above described embodiment, both firmware and operation data are copied from one common sound field apparatus to another, but copying of at least operation data suffices because firmware can be supplied from a manufacturer in a relatively easy way.

Although in the above described embodiment, the sound field control apparatus is configured such that master and slave sound field control data are stored in each common sound field apparatus, but may be stored in only one of the common sound field apparatuses so that sound field control data for each device can be transferred from the one common sound field apparatus to another via a cascade connection cable when power supply of the sound field control apparatus is turned on, or when a sound field pattern is selected. In this case, however, it is necessary to wait for a long period of time until sound field control becomes effective after power supply of the sound field control apparatus is turned on, after a sound field pattern is selected. Further, each common sound field apparatus may be provided with a slot for a detachable medium such as a memory card or a small-sized hard disk, and such a detachable medium in which sound field control data is stored may be inserted into the slot or slots of any one or a plurality of common sound field apparatuses constituting a sound field control apparatus. If sound field control data is stored in such a detachable medium, the sound field control data can be easily transferred from a failed common sound field apparatus to an alternative common sound field apparatus. In this case, however, the common sound field control apparatus becomes complicated in structure due to the slot, and sound field control data stored in a detachable medium may be broken depending on the status of a failed common sound field apparatus Although in the above described embodiment, the sound field control apparatus is configured such that the control panel 2 can be connected only to the master device, but may be configured such that the control panel 2 can be connected to an arbitrary slave device. In this case, a plurality of control panels 2 may be connected, and hence even if the control panel 2 connected to an arbitrary slave device is manipulated, it is advantageous to configure such that the manipulation as well as an instruction for changing sound field patterns is transmitted once to the master device and then transmitted from the master device to the slave device via cascade connection. Namely, even in the case where the control panel or panels are connected to any slave device or devices, the master device is caused to carry out substantial communication with the control panel or panels.

Further, although in the above described embodiment, a piece of sound field control data is selected according to a sound field pattern designating signal and a liveness designating signal from the control panel 2, this is not limitative, a sound field pattern and a liveness thereof may be designated according to a MIDI message such as a program change from the MIDI machine **8*b* connected to the master device, or a control signal from a control application on the personal computer 4** or any other application.

Further, in the above described embodiment, any common sound field apparatus may serve as the master device, and hence firmware and operation data are copied only in a direction from upstream to downstream in cascade connection, but in the case where the master device and the slave devices are each exclusive, it is preferred that firmware and operation data are copied from downstream to upstream. If two-way copying is possible, however, there is a high possibility that copying is performed in an erroneous direction due to an operation error to erase necessary operation data. In the sound field control apparatus according to the present invention, however, there is no possibility that necessary data is erased due to an operation error insofar as a common sound field apparatus which is to replace a failed common sound field apparatus is connected downstream in cascade.

It is to be understood that the object of the present invention may also be accomplished by supplying a system or an apparatus with a storage medium (or recording medium) in which a program code of software which realizes the functions of the above described embodiment is stored, and causing a computer (or CPU or MPU) of the system or apparatus to read out and execute the program code stored in the storage medium.

In this case, the program code itself read out from the storage medium realizes the functions of the embodiment described above, and hence the program code and the storage medium in which the program code is stored constitute the present invention.

Further, it is to be understood that the functions of the above described embodiment may be accomplished not only by executing a program code read out by a computer, but also by causing an operating system (OS) or the like which operates on the computer to perform a part or all of the actual operations based on instructions of the program code.

Further, it is to be understood that the functions of the above-described embodiment may be accomplished by writing a program code read out from the storage medium, into a memory provided on an expansion board inserted into a computer or in an expansion unit connected to the computer and then causing a CPU or the like provided in the expansion board or the expansion unit to perform a part or all of the actual operations based on instructions of the program code.

Further, the above program has only to realize the functions of the above-described embodiment on a computer, and the form of the program may be an object code, a program executed by an interpreter, or script data supplied to an OS.

Examples of the storage medium for supplying the program include a floppy (registered trademark) disk, a hard disk, an optical disk, a magneto-optical disk, a CD-ROM, an MO, a CD-R, a CD-RW, a DVD (DVD-ROM, DVD-RAM, DVD-RW, DVD+RW), a magnetic tape, a nonvolatile memory card, and a ROM. Alternatively, the program may be supplied by downloading from another computer, a database, or the like, not shown, connected to the Internet, a commercial network, a local area network, or the like.

What is claimed is:

1. A sound field control apparatus comprising:

a master device comprising a picked-up sound signal input section that inputs picked-up sound signals from a plurality of microphones installed at different locations, a reflected sound signal generating section that generates reflected sound signals by performing signal processing on the input picked-up sound signals according to a master algorithm including a signal switch circuit and plural reflectors, and a reflected sound signal output section that outputs the generated reflected sound signals; and a plurality of slave devices connected in cascade to said master device, each of said slave devices comprising a reflected sound signal input section that inputs the generated reflected sound signals from said master device, and a plurality of output signal generating sections corresponding to a plurality of speakers installed at different locations, each of said plurality of output signal generating sections adjusting sound characteristics of the input reflected sound signals, mixing the adjusted input signals to generate an output signal, and outputting the output signal to the corresponding speakers, according to a slave algorithm including delay devices for adjusting the reflected sounds in delay, attenuators for adjusting the reflected sounds in level, and adders for mixing the adjusted signals, and a reflected sound signal output section that directly outputs the input reflected sound signals to the next one of said slave devices;

wherein said slave devices comprise a desired number of slave devices serially connected in cascade to said master device, and said speakers correspond in number to a number of said slave devices.

2. A sound field control apparatus according to claim 1, wherein said master device further comprises a first storage device that stores plural pieces of first sound field control data for controlling a reflected sound signal generating process carried out by said reflected sound signal generating section, a first selecting device that selects one piece of the first sound field control data from among the plural pieces of the first sound field control data stored in said first storage device according to a user's selecting operation, and a transmitting device that transmits selection information indicative of the user's selecting operation to said slave devices serially connected in cascade, and wherein said reflected sound signal generating section of said master device generates reflected sound signals based on the sound field control data selected by said first selecting device, and each of said slave devices further comprises a second storage device that stores plural pieces of second sound field control data for controlling an output signal generating process carried out by said plurality of output signal generating sections, and a second selecting device that selects one piece of the second sound field control data from among the plural pieces of the second sound field control data stored in said second storage device according to the selection information transmitted from said master device, and each of said plurality of output signal generating sections adjusts the sound characteristics according to the second sound field control data selected by said second selecting device.

3. A sound field control apparatus comprising:

a plurality of common signal processing apparatuses identical in construction, serially connected in cascade to each other, each of said common signal processing apparatuses comprising:

a cascade input/output section that inputs signals from one of said common signal processing apparatuses which is connected at a previous stage to the common signal processing apparatus and outputs signals to another one of said common signal processing apparatuses which is connected at a next stage to the common signal processing apparatus;

a determining device that determines at which stage the common signal processing apparatus is connected in cascade;

a storage device that stores operation control data for a master algorithm and a slave algorithm;

an external signal input/output section that externally inputs and outputs signals; and a signal processing section operable, when said determining device determines that the common signal processing apparatus is connected in cascade at the first stage, to form reflected sound signals by performing signal processing, on microphone picked-up signals input from said external signal input/output section, according to the master algorithm including a signal switching circuit and plural reflectors, based on the operation control data stored in said storage device, and output the formed reflected sound signals to ones of said common signal processing apparatuses, which are connected in cascade at second and subsequent stages, said signal processing section being operable, when said determining device determines that the common signal processing apparatus is connected in cascade at the second or a subsequent stage, to form speaker output signals by performing signal processing, on the reflected sound signals input from said common signal processing apparatus connected in cascade at the previous stage via said cascade input/output section, according to the slave algorithm including delay devices for adjusting the reflected sounds in delay, attenuators for adjusting the reflected sounds in level, and adders for mixing the adjusted signals, based on the operation control data stored in said storage device, and output the formed speaker output signals to said external signal input/output section, and wherein when said determining device determines that the common signal processing apparatus is connected in cascade at the second stage or a subsequent stage, said cascade input/output section outputs the input reflected sound signals to said common signal processing apparatus connected in cascade at the next stage via said cascade input/output section.

4. A sound field control apparatus comprising:

a plurality of common sound field apparatuses identical in construction, serially connected in cascade to each other, each of said common sound field apparatuses comprising:

a cascade input/output section that inputs signals from one of said common sound field apparatuses which is connected at a previous stage to the common sound field apparatus and outputs signals to another one of said common sound field apparatuses which is connected at a next stage to the common sound field apparatus;

a determining device that determines at which stage the common sound field apparatus is connected in cascade;

a storage device that stores operation control data for a master algorithm and a slave algorithm, and master and slave sound field control parameters for obtaining a desired sound field pattern;

an external signal input/output section that externally inputs and outputs signals;

a signal processing section operable, when said determining device determines that said common sound field apparatus is connected in cascade at the first stage, to form reflected sound signals by performing signal processing, on microphone picked-up signals input from said external signal input/output section, according to the master algorithm including a signal switching circuit and plural reflectors, based on the operation control data stored in said storage device, and output the formed reflected sound signals to ones of said common sound field apparatuses, which are connected in cascade at second and subsequent stages, said signal processing section being operable, when said determining device determines that said common sound field apparatus is connected in cascade at the second or a subsequent stage, to form speaker output signals by performing signal processing, on the reflected sound signals input from said common sound field apparatus connected in cascade at a previous stage via said cascade input/output section, according to the slave algorithm including delay devices for adjusting the reflected sounds in delay, attenuators for adjusting the reflected sounds in level, and adders for mixing the adjusted signals, based on the operation control data stored in said storage device, and output the formed speaker output signals to said external signal input/output section; and a parameter supply device operable when said determining device determines that said common sound field apparatus is connected in cascade at the first stage, to fetch the master sound field control parameters stored in said storage device and supply the fetched master sound field control parameters to said signal processing section, and operable when said determining device determines that said common sound field apparatus is connected in cascade at the second or a subsequent stage, to fetch sound field control parameters for the determined stage from the slave sound field control parameters stored in said storage device and supply the fetched sound field control parameters to said signal processing section, and wherein when said determining device determines that the common signal processing apparatus is connected in cascade at the second stage or a subsequent stage, said cascade input/output section outputs the input reflected sound signals to said common signal processing apparatus connected in cascade at the next stage via said cascade input/output section.

5. A sound field control apparatus according to claim 4, comprising a sound field pattern designating device capable of designating one of a plurality of sound field patterns, and wherein said storage device of said common sound field apparatus stores a plurality of master and slave sound field control parameters corresponding to the plurality of sound field patterns, and said parameter supply device is operable when said determining device determines that said common sound field apparatus is connected in cascade on the first stage, to fetch the master sound field control parameters corresponding to the sound field pattern designated by said sound field pattern designating device from said storage device and supply the fetched master sound field control parameters to said signal processing section, and is operable when said determining device determines that said common sound field apparatus is connected in cascade on the second or a subsequent stage, to fetch sound field control parameters corresponding to the sound field pattern designated by said sound field designating device from said storage device and supply the fetched slave sound field control parameters to said signal processing section.

6. A sound field apparatus according to claim 3, wherein each of said common signal processing apparatuses further comprises at least one connection terminal for connecting to at lease one external apparatus selected from the group consisting of a computer, a MIDI machine, and a control panel, and a communication device operable when said determining device determines that said common signal processing apparatus is connected in cascade on the first stage, to carry out communication with the at least one external apparatus connected to said connection terminal and control overall operation of the signal processing apparatus according to a result of the communication.

7. A sound field control apparatus according to claim 4, wherein each of said common sound field apparatuses further comprises at least one connection terminal for connecting to at lease one external apparatus selected from the group consisting of a computer, a MIDI machine, and a control panel, and a communication device operable when said determining device determines that said common sound field apparatus is connected in cascade on the first stage, to carry out communication with the at least one external apparatus connected to said connection terminal and control overall operation of the sound field control apparatus according to a result of the communication.

8. A sound field control apparatus according to claim 5, wherein each of said common sound field apparatuses further comprises at least one connection terminal for connecting to at lease one external apparatus selected from the group consisting of a computer, a MIDI machine, and a control panel, and a communication device operable when said determining device determines that said common sound field apparatus is connected in cascade on the first stage, to carry out communication with the at least one external apparatus connected to said connection terminal and control overall operation of the sound field control apparatus according to a result of the communication.

9. A sound field control apparatus according to claim 4, comprising a copying device responsive to a copying instruction, for copying the operation control data and the master and slave sound field control parameters between said storage device of said common sound field apparatus and said storage device of each of the other common sound field apparatuses connected in cascade to said common sound field apparatus.

10. A sound field control apparatus comprising:

a master device;

at least one slave device connected in cascade to said master device;

wherein said master device comprises a first storage device that stores at least master and slave sound field control data for obtaining a desired sound field pattern, an external input section that inputs picked-up sound signals from a plurality of microphones installed at different locations, a reflected sound signal generating section that performs signal processing on the input picked-up sound signals according to a master algorithm, including a signal switching circuit and plural reflectors, based on the master sound field control data stored in said first storage device to generate reflected sound signals, and a cascade output section that outputs the generated reflected sound signals to said slave device connected in cascade to said master device;

said slave device comprises a second storage device that stores at least sound field control data identical with the master and slave sound field control data stored in said first storage device, a cascade input section that inputs the reflected sound signals from said master device to which said slave device is connected in cascade, an external output section that output a plurality of output signals to be sounded by a plurality of speakers installed at different locations, and an output signal generating section that performs signal processing on the input reflected sound signals according to a slave algorithm, including delay devices for adjusting the reflected sounds in delay, attenuators for adjusting the reflected sounds in level, and adders for mixing adjust signals, based on the slave sound field control data stored in said second storage device to generate the plurality of output signals; and a copying device responsive to a copying instruction, for copying the sound field control data between said first storage device of said master device and said second storage device of said slave device.

11. A computer-readable storage medium storing a sound field control program executed by a signal processing apparatus comprising a plurality of common signal processing apparatuses identical in construction, serially connected in cascade to each other, said sound field control program comprising:

a cascade input/output module for inputting signals from one of the common signal processing apparatuses which is connected at a previous stage to the common signal processing apparatus and outputting signals to another one of the common signal processing apparatuses which is connected at a next stage to the common signal processing apparatus;

a determining module for determining at which stage the common signal processing apparatus is connected in cascade;

a storage module for storing operation control data for a master algorithm and a slave algorithm;

an external signal input/output module for externally inputting and outputting signals; and a signal processing module operable, when said determining module determines that the common signal processing apparatus is connected in cascade at the first stage, to form reflected sound signals by performing signal processing, on microphone picked-up signals input by said external signal input/output module, according to the master algorithm including a signal switching circuit and plural reflectors, based on the operation control data stored by said storage module, and output the formed reflected sound signals to ones of the common signal processing apparatuses, which are connected in cascade at second and subsequent stages, said signal processing module being operable, when said determining module determines that the common signal processing apparatus is connected in cascade at the second or a subsequent stage, to form speaker output signals by performing signal processing, on the reflected sound signals input from the common signal processing apparatus connected in cascade at the previous stage via said cascade input/output module, according to the slave algorithm including delay devices for adjusting the reflected sounds in delay, attenuators for adjusting the reflected sounds in level, and adders for mixing the adjusted signals, base on the operation control data stored by said storage module, and output the formed speaker output signals to said external signal input/output module, and wherein when said determining module determines that the common signal processing apparatus is connected in cascade at the second stage or a subsequent stage, said cascade input/output module outputs the input reflected sound signals to said common signal processing apparatus connected in cascade at the next stage via said cascade input/output section.

12. A computer-readable storage medium storing a sound field control program executed by a sound field control apparatus comprising a plurality of common sound field apparatuses identical in construction, serially connected in cascade to each other, said sound field control program comprising:

a cascade input/output module for inputting signals from one of the common sound field apparatuses which is connected at a previous stage to the common signal processing apparatus and outputting signals to another one of the common sound field apparatuses which is connected at a next stage to the common sound field apparatus;

a determining module for determining at which stage the common sound field apparatus is connected in cascade;

a storage module for storing operation control data for a master algorithm and a slave algorithm, and master and slave sound field control parameters for obtaining a desired sound field pattern;

an external signal input/output module for externally inputting and outputting signals;

a signal processing module operable, when said determining module determines that the common sound field apparatus is connected in cascade at the first stage, to form reflected sound signals by performing signal processing, on microphone picked-up signals input by said external signal input/output module, according to the master algorithm including a signal switching circuit and plural reflectors, based on the operation control data stored by said storage module, and output the formed reflected sound signals to ones of the common sound field apparatuses, which are connected in cascade at second and subsequent stages, said signal processing module being operable, when said determining device module that the common sound field apparatus is connected in cascade at the second or a subsequent stage, to form speaker output signals by performing signal processing, on the reflected sound signals input from the common sound field apparatus connected in cascade at the previous stage via said cascade input/output module, according to the slave algorithm including delay devices for adjusting the reflected sounds in delay, attenuators for adjusting the reflected sounds in level, and adders for mixing the adjusted signals, based on the operation control data stored by said storage module, and output the formed speaker output signals to said external signal input/output module; and a parameter supply module operable when said determining module determines that the common sound field apparatus is connected in cascade at the first stage, to fetch the master sound field control parameters stored in said storage module and supply the fetched master sound field control parameters to said signal processing module, said parameter supply module being operable when said determining module determines that the common sound field apparatus is connected in cascade on the second or a subsequent stage, to fetch sound field control parameters for the determined stage from the slave sound field control parameters stored by said storage module and supply the fetched sound field control parameters to said signal processing module, and wherein when said determining module determines that the common signal processing apparatus is connected in cascade at the second stage or a subsequent stage, said cascade input/output module outputs the input reflected sound signals to said common signal processing apparatus connected in cascade at the next stage via said cascade input/output section.

13. A computer-readable storage medium storing a sound field control program executed by a sound field control apparatus comprising a master device and at least one slave device connected in cascade to the master device, said sound field control program comprising;

a first storage module for storing at least master and slave sound field control data for obtaining a desired sound field pattern, in the master device, an external input module for inputting picked-up sound signals from a plurality of microphones installed at different locations;

a reflected sound signal generating module for performing signal processing on the input picked-up sound signals according to a master algorithm, including a signal switching circuit and plural reflectors, based on the master sound field control data stored by said first storage module to generate reflected sound signals;

a cascade output module for outputting the generated reflected sound signals to said slave module connected in cascade to the master device;

a second storage module for storing at least sound field control data identical with the master and slave sound field control data stored by said first storage module, in the slave device, a cascade input module for inputting the reflected sound signals from said master module to which the slave device is connected in cascade, an external output module for output a plurality of output signals to be sounded by a plurality of speakers installed at different locations, an output signal generating module for performing signal processing on the input reflected sound signals according to a slave algorithm, including delay devices for adjusting the reflected sounds in delay, attenuators for adjusting the reflected sounds in level, and adders for mixing the adjusted signals, based on the slave sound field control data stored by said second storage module to generate the plurality of output signals; and a copying module responsive to a copying instruction, for copying the sound field control data between said first storage device of said master device and said second storage module of the slave device.

* * * * *